United States Patent
Teeters et al.

(10) Patent No.: US 9,601,747 B2
(45) Date of Patent: Mar. 21, 2017

(54) NANOPATTERNED SUBSTRATE SERVING AS BOTH A CURRENT COLLECTOR AND TEMPLATE FOR NANOSTRUCTURED ELECTRODE GROWTH

(71) Applicant: The University of Tulsa, Tulsa, OK (US)

(72) Inventors: Dale Teeters, Tulsa, OK (US); Matthew Smith, Tulsa, OK (US)

(73) Assignee: The University of Tulsa, Tulsa, OK (US)

( * ) Notice: Subject to any disclaimer, the term of this patent is extended or adjusted under 35 U.S.C. 154(b) by 877 days.

(21) Appl. No.: 13/803,582

(22) Filed: Mar. 14, 2013

(65) Prior Publication Data
US 2013/0185930 A1    Jul. 25, 2013

Related U.S. Application Data

(63) Continuation-in-part of application No. 12/695,835, filed on Jan. 28, 2010, now Pat. No. 8,574,744, and a
(Continued)

(51) Int. Cl.

| | |
|---|---|
| *H01M 6/42* | (2006.01) |
| *H01M 4/04* | (2006.01) |
| *C23C 14/34* | (2006.01) |
| *C25F 3/16* | (2006.01) |
| *C25D 11/02* | (2006.01) |
| *C25D 11/04* | (2006.01) |
| *C25D 11/08* | (2006.01) |
| *C25D 11/16* | (2006.01) |

(Continued)

(52) U.S. Cl.
CPC ........... *H01M 4/0404* (2013.01); *C23C 14/34* (2013.01); *C25D 11/024* (2013.01); *C25D 11/045* (2013.01); *C25D 11/08* (2013.01); *C25D 11/16* (2013.01); *C25D 11/24* (2013.01); *C25F 3/16* (2013.01); *H01L 31/0352* (2013.01); *H01L 31/0392* (2013.01); *H01L 31/0543* (2014.12); *H01L 31/0547* (2014.12); *H01M 4/0426* (2013.01); *H01M 4/139* (2013.01); *H01M 4/70* (2013.01); *H01M 2010/0495* (2013.01); *Y02E 10/52* (2013.01); *Y02E 60/122* (2013.01); *Y10T 29/49115* (2015.01)

(58) Field of Classification Search
CPC ....... C25D 11/024; C25D 11/08; C25D 11/16; C25D 11/24; C25D 11/045; H01M 4/0404; H01M 4/0426; H01M 4/139; H01M 4/70; H01M 2010/0495; C23C 14/34; C25F 3/16; H01L 31/0352; H01L 31/0392; H01L 31/0543; H01L 31/0547; Y10T 29/49115; Y02E 60/122
USPC .......................................................... 429/149
See application file for complete search history.

(56) References Cited

U.S. PATENT DOCUMENTS

| | | | | |
|---|---|---|---|---|
| 2002/0106447 A1* | 8/2002 | Lindstrom | ........... | H01G 9/2031 427/126.3 |
| 2006/0234505 A1* | 10/2006 | Asano | ................... | B82Y 10/00 438/688 |

* cited by examiner

*Primary Examiner* — Gary Harris
(74) *Attorney, Agent, or Firm* — Head, Johnson, Kachigian & Wilkinson, PC

(57) ABSTRACT

A process of forming and the resulting nano-pitted metal substrate that serves both as patterns to grow nanostructured materials and as current collectors for the resulting nanostructured material is disclosed herein. The nano-pitted substrate can be fabricated from any suitable conductive material that allows nanostructured electrodes to be grown directly on the substrate.

13 Claims, 22 Drawing Sheets

Related U.S. Application Data continuation of application No. 11/383,146, filed on May 12, 2006, now Pat. No. 7,736,724.

(60) Provisional application No. 61/148,671, filed on Jan. 30, 2009, provisional application No. 60/681,222, filed on May 13, 2005.

(51) Int. Cl.
*C25D 11/24* (2006.01)
*H01M 4/139* (2010.01)
*H01M 4/70* (2006.01)
*H01L 31/0352* (2006.01)
*H01L 31/0392* (2006.01)
*H01L 31/054* (2014.01)
*H01M 10/04* (2006.01)

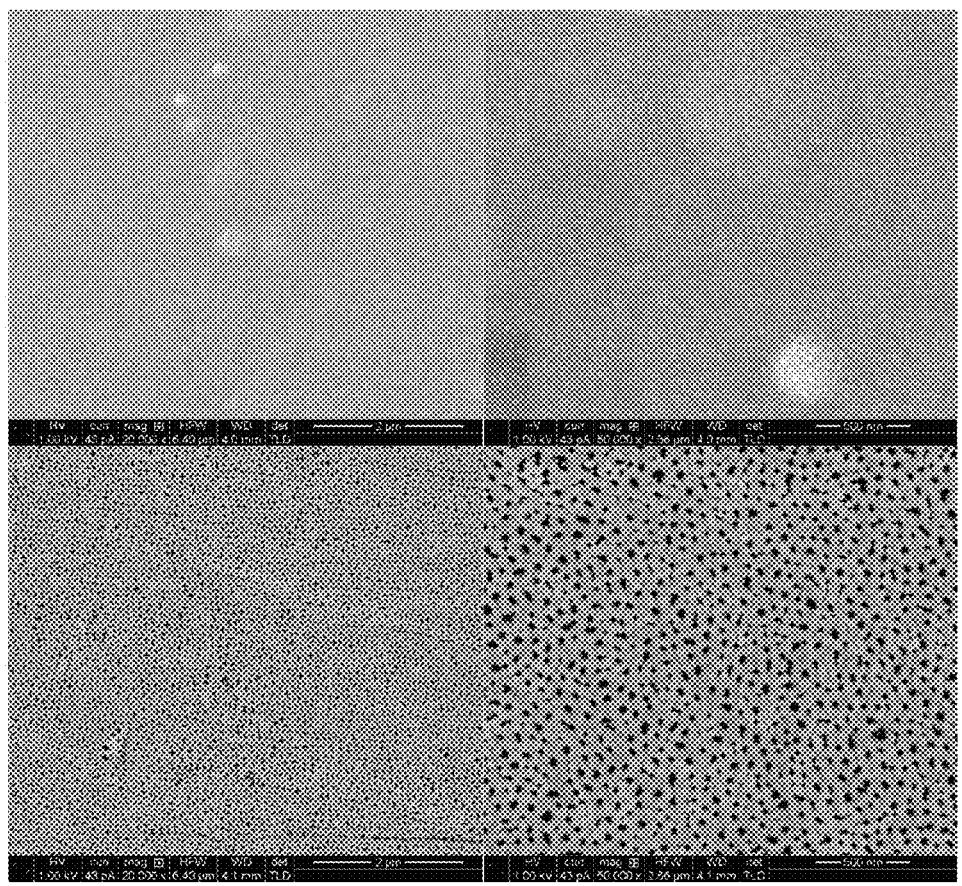
FIG. 18A-D

NANOPATTERNED SUBSTRATE SERVING AS BOTH A CURRENT COLLECTOR AND TEMPLATE FOR NANOSTRUCTURED ELECTRODE GROWTH

CROSS-REFERENCE TO RELATED APPLICATIONS

This application claims priority to and is a continuation-in-part of U.S. patent application Ser. No. 12/695,835 filed Jan. 28, 2010, which claims priority to U.S. Provisional Patent Application Ser. No. 61/148,671, filed Jan. 30, 2009, and U.S. patent application Ser. No. 11/383,146 filed May 12, 2006, now U.S. Pat. No. 7,736,724 issued Jun. 15, 2010, which claims priority to U.S. Provisional Patent Application Ser. No. 60/681,222 filed May 13, 2005, each of which is incorporated herein by reference in its entirety.

STATEMENT REGARDING FEDERALLY SPONSORED RESEARCH OR DEVELOPMENT

Not Applicable.

BACKGROUND OF THE INVENTION

1. Field of the Invention

This invention relates generally to a process of forming a nano-pitted substrate that serves both as patterns to grow nanostructured materials and as current collectors for the nanostructured material that has been grown thereupon.

2. Description of the Related Art

The potential of nanotechnology to provide new technological breakthroughs is the object of much current attention. Nanostructured materials have the potential for enhanced properties and efficiency improvements in virtually every area of science and technology through enhanced surface areas and quantum-scale reactions.

The process of nanoscale or microscale deposition of particles by a sputtering process is the ejection of particles from a condensed-matter target due to the impingement of energetic projectile particles onto a substrate having a plurality of holes or pores that range in diameter between ten (10) micrometers to one (1) nanometer (nm). Operatively, the source of coating material, referred to as the target or substrate, is mounted opposite to the sample, in this case a porous substrate in a vacuum chamber. The most common method of generating ion bombardment is to backfill the evacuated chamber with a continual flow of gas and establishing a glow discharge, indicating that ionization is occurring. A negative potential applied to the target causes it to be bombarded with positive-ions while the substrate is kept grounded. Impingement of the positive-ion projectile results in ejection of target atoms or molecules and their deposition on the substrate.

One of the most useful characteristics of the sputtering process is its universality: virtually any material is a coating candidate. Sputtering systems assume an almost unlimited variety of configurations, depending on the desired application. DC discharge methods are often used for sputtering metals, while an RF potential is used for less conductive materials. Ion-beam sources can also be used. Targets may be elements, alloys, or compounds, in either doped or un-doped forms, and can be employed simultaneously or sequentially. The substrate may be electrically biased so that it too undergoes ion bombardment. A reactive gas may be used to introduce one of the coating constituents into the chamber, i.e. oxygen to combine with sputtered tin to form tin oxide (reactive sputtering).

A nanostructure fabricated by RF sputtering of barium strontium titanate (BST) on porous alumina substrates suggests that the sputtered material does not penetrate into pores, but rather preferentially gathers along the continuous circular edge of pore openings. These types of sputtered metal structure or "antidots" are not partially or complete capped, are not layered, are formed only from metals, and are not used to assemble any type device.

Nanotubes and other nanostructures may be formed as large arrays, and in this form are often referred to as nanoporous or mesoporous structures. "Meso-porous" tin oxide structures have been created using surfactant templating techniques. The resultant material, however, consists of material containing irregular nanopores averaging about two (2) nm in size, without long-range order. These nanoporous or mesoporus structures cannot be formed in large arrays of tunable pore sizes, which develop wall height as well as porosity, and also cannot be partially or completely capped to form a nanobasket structure.

The assembly of individual nanostructured components into a three-dimensional battery system has been proposed as the means to promote ion diffusion in electrode materials by substantially increasing the effective electrode surface area to improve energy per unit area characteristics and promote a high rate charge/discharge capacity. Such features should enhance general battery performance, but they are of particular importance for thin film batteries and nanobatteries able to power proposed micro and nano electromechanical systems (MEMS and NEMS). Recent work on three-dimensional architectures for improved performance includes rods or "posts" connected to a substrate, graphite meshes and films of cathode, electrolyte and anode materials lining microchannels in an inert substrate.

Moreover, nanostructured electrode materials have been shown to have enhanced electrode properties such as faster charging/discharging properties and higher available capacities. These electrodes have the potential to be placed in battery configurations, especially where thin film construction is used. The two current collectors which are conductive material in the battery that collect electrons (on the anode side) or disburse electrons (on the cathode side) are present. It is the current collectors that serve to make contact between the devices that batteries power on one side and the two electrodes of the battery on their opposite sides.

Prior nanostructured electrode materials were grown from a substrate that is an insulating material, such as alumina. As the electrode material is grown on the substrate, the structure of the substrate is maintained as the sputter coated layer becomes thicker. However, the growth substrate, being an insulator, cannot serve as a current collector. As such, in order to construct a battery, the delicate nanostructured electrode must be removed from the substrate and a current collector must then be connected to the delicate nanostructured electrode (sometimes the layer is only 500 nm thick) without damaging it. This is one of the important considerations for application of nanoscale materials and engineering into what will result in a "real world" sized product is how to connect the nanoscale aspects of the system to the macroscale.

It is therefore desirable to provide a nanopatterned substrate that serves as both a current collector and template for nanostructured electrode growth.

It is further desirable to provide a process of constructing of a nanostructured current collector that serves as both a current collector and as a substrate to grow nanostructured electrode materials.

It is still further desirable to provide a nanopatterned substrate that serves as both a current collector and template for nanostructured electrode growth that bridges the gap between the nanoscale environment and the macroscale of commercial batteries.

It is yet further desirable to provide a nanopatterned substrate that serves as both a current collector and template for nanostructured electrode growth for thin film batteries and nanobatteries, which would be able to power proposed micro- and nano-electromechanical systems (MEMS and NEMS), or used in massive arrays in place of conventional batteries.

It is still yet further desirable to provide a process for manufacturing thin film batteries and nanobatteries using short, capped nanotubes, i.e., nanobaskets, electrochemical deposited directly on a nanopatterned substrate, which serves as both a current collector and the nanobasket growth template.

It is further desirable to provide a thin film battery or nanobattery constructed on a nano-pitted metal that serves as the growth substrate and the current collector for the electrode.

It is further desirable to provide a process of fabricating a thin film battery or nanobattery in which the electrode material does not have to be removed from its growth substrate.

SUMMARY OF THE INVENTION

In general, in a first aspect, the invention relates to a method of fabricating a nanostructure by forming an electrically conductive substrate having at least one nano-pit and then depositing at least one material along the nano-pit to form a nanostructure. The conductive substrate can include a plurality of the nano-pits, each having a diameter of from about 1 nm to about 10 micrometers. The conductive substrate can be constructed from a metal, metal alloy, electrolyte, superconductor, semiconductor, plasma, graphite or conductive polymer. The metal can be aluminum (Al), antimony (Sb), bismuth (Bi), boron (B), cadmium (Cd), carbon (C), cerium (Ce), chromium (Cr), cobalt (Co), copper (Cu), dysprosium (Dy), erbium (Er), europium (Eu), gadolinium (Gd), germanium (Ge), gold (Au), graphite (C), hafnium (Hf), holmium (Ho), indium (In), iridium (Ir), iron (Fe), lanthanum (La), lutetium (Lu), magnesium (Mg), manganese (Mn), molybdenum (Mo), neodymium (Nd), nickel (Ni), niobium (Nb), palladium (Pd), platinum (Pt), praseodymium (Pr), rhenium (Re), ruthenium (Ru), samarium (Sm), selenium (Se), scandium (Sc), silver (Ag), silicon (Si), tantalum (Ta), terbium (Tb), thulium (Tm), tin (Sn), titanium (Ti), tungsten (W), vanadium (V), ytterbium (Yb), yttrium (Y), zirconium (Zr) or zinc (Zn). The metal alloy can be aluminum copper (AlCu), aluminum chromium (AlCr), aluminum magnesium (AlMg), aluminum silicon (AlSi), aluminum silver (AlAg), cerium gadolinium (CeGd), cerium samarium (CeSm), chromium silicon (CrSi), cobalt chromium (CoCr), cobalt iron (CoFe), cobalt iron boron (CoFeB), copper cobalt (CuCo), copper gallium (CuGa), copper indium (CuIn), copper nickel (CuNi), copper zirconium (CuZr), hafnium iron (HfFe), iron boron (FeB), iron carbon (FeC), iron manganese (FeMn), iridium manganese (IrMn), iridium rhenium (IrRe), indium tin (InSn), molybdenum silicon (MoSi), nickel aluminum (NiAl), nickel chromium (NiCr), nickel chromium silicon (NiCrSi), nickel iron (NiFe), nickel niobium titanium (NiNbTi), nickel titanium (NiTi), nickel vanadium (NiV), samarium cobalt (SmCo), silver copper (AgCu), silver tin (AgSn), tantalum aluminum (TaAl), terbium dysprosium iron (TbDyFe), terbium iron alloy (TbFe), titanium aluminum (TiAl), titanium nickel (TiNi), titanium chromium (TiCr), tungsten rhenium (WRe), tungsten titanium (WTi), zirconium aluminum (ZrAl), zirconium iron (ZrFe), zirconium nickel (ZrNi), zirconium niobium (ZrNb), zirconium titanium (ZrTi), zirconium yttrium (ZrY), zinc aluminum (ZnAl) or zinc magnesium (ZnMg).

The material can be deposited by sputter-coating, chemical vapor deposition or pulsed laser method, such as direct current sputter-coating, radio frequency sputter-coating, magnetron sputter-coating or reactive sputter-coating. The material deposited can be an oxide, polymeric, ceramic, mineral or metallic material, such as carbon, silicon, graphite, a copper oxide, a metal alloy, a mixed metal oxide, a lithium-containing oxide, a phosphate, a fluorophosphate, a silicate, tin oxide, zinc oxide, titanium oxide, titanium dioxide, vanadium pentoxide, magnesium oxide, silicon dioxide, nichrome, hydroxyapatite, tin oxide ($SnO_2$), lithium cobalt oxide ($LiCoO_2$), zinc oxide, copper oxide, titanium oxide, titanium dioxide, vanadium pentoxide, magnesium oxide, silicon dioxide, nichrome, $Li_4Ti_5O_{12}$, $Li_4Ti_5O_{12}$, $LiNixCO_{1-2x}MnO_2$, $LiNi_{0.5}Mn_{1.5}O_4$, $Li(Ni_{0.8}Co_{0.15}Al_{0.05})O_2$, $LiMn_2O_4$, iron olivine ($LiFePO_4$), $LiFe_{1-x}MgPO_4$, $LiMoPO_4$, $LiCoPO_4$, $LiNiPO_4$, $Li_3V_2(PO_4)_3$, $LiVOPO_4$, $LiMP_2O_7$, $LiFe_{1.5}P_2O_7$, $LiVPO_4F$, $LiAlPO_4F$, $Li_5V(PO_4)_2F_2$, $Li_5Cr(PO_4)_2F_2$, $Li_2COPO_4F$, $Li_2NiPO_4F$, $Li_2FeSiO_4$, $Li_2MnSiO_4$ or $Li_2VOSiO_4$.

In addition, at least one additional material may be deposited to form a layered nanostructure. The material can be deposited directly along the nano-pit to form the nanostructure, and the nanostructure can be a nanostructured electrode where the conductive substrate serves as both current collector and growth substrate for the nanostructure electrode. The conductive substrate can be formed using laser ablation, a chemical etching process, an electrochemical process, track etching, micro- or nano-lithography, contact lithography, X-ray-beam lithography, electron-beam lithography, ion-beam lithography, photo-lithography, nano-imprint lithography or chemical self-assembly.

In general, in a second aspect, the invention relates to a method for fabricating a nano-pitted substrate. The method can be accomplished by chemically polishing a metal thin film in a first acid, such as phosphoric acid, for a predetermined amount of polishing time, such as approximately five minutes, and then oxidizing the metal thin film with an acidic solution, such as an oxalic acid electrolyte solution, in an electrochemical cell at a predetermined temperature, such as approximately four degrees Celsius, a first predetermined voltage potential, such as approximately forty volts, and for a predetermined amount of oxidation time, such as approximately one hour. Subsequently, the first predetermined voltage potential is decreased at a predetermined step-down rate, such as approximately two volts per minute, to a second predetermined voltage potential, such as approximately two volts. Lastly, the oxidized metal thin film is etched with a second acid, such as phosphoric acid, to form the nano-pitted substrate.

In general, in a third aspect, the invention relates to a method of constructing a nanobattery. The method includes forming a nanostructured anode electrode on a nano-pitted anode substrate, forming a nanostructured cathode electrode on a nano-pitted cathode substrate and forming an electrolyte layer intermediate of the nanostructured anode cathode and the nanostructured anode to construct the nanobattery. The nano-pitted anode substrate and the cathode substrate respectively serve as both a current collector and a growth substrate for the nanostructured electrode.

The anode substrate and/or the cathode substrate is constructed by laser ablation, a chemical etching process, an electrochemical process, track etching, micro- or nano-lithography, contact lithography, X-ray-beam lithography, electron-beam lithography, ion-beam lithography, photo-lithography, nano-imprint lithography or chemical self-assembly from a metal, metal alloy, electrolyte, superconductor, semiconductor, plasma, graphite or conductive polymer. The metal can include aluminum (Al), antimony (Sb), bismuth (Bi), boron (B), cadmium (Cd), carbon (C), cerium (Ce), chromium (Cr), cobalt (Co), copper (Cu), dysprosium (Dy), erbium (Er), europium (Eu), gadolinium (Gd), germanium (Ge), gold (Au), graphite (C), hafnium (Hf), holmium (Ho), indium (In), iridium (Ir), iron (Fe), lanthanum (La), lutetium (Lu), magnesium (Mg), manganese (Mn), molybdenum (Mo), neodymium (Nd), nickel (Ni), niobium (Nb), palladium (Pd), platinum (Pt), praseodymium (Pr), rhenium (Re), ruthenium (Ru), samarium (Sm), selenium (Se), scandium (Sc), silver (Ag), silicon (Si), tantalum (Ta), terbium (Tb), thulium (Tm), tin (Sn), titanium (Ti), tungsten (W), vanadium (V), ytterbium (Yb), yttrium (Y), zirconium (Zr) or zinc (Zn), and the metal alloy can include aluminum copper (AlCu), aluminum chromium (AlCr), aluminum magnesium (AlMg), aluminum silicon (AlSi), aluminum silver (AlAg), cerium gadolinium (CeGd), cerium samarium (CeSm), chromium silicon (CrSi), cobalt chromium (CoCr), cobalt iron (CoFe), cobalt iron boron (CoFeB), copper cobalt (CuCo), copper gallium (CuGa), copper indium (CuIn), copper nickel (CuNi), copper zirconium (CuZr), hafnium iron (HfFe), iron boron (FeB), iron carbon (FeC), iron manganese (FeMn), iridium manganese (IrMn), iridium rhenium (IrRe), indium tin (InSn), molybdenum silicon (MoSi), nickel aluminum (NiAl), nickel chromium (NiCr), nickel chromium silicon (NiCrSi), nickel iron (NiFe), nickel niobium titanium (NiNbTi), nickel titanium (NiTi), nickel vanadium (NiV), samarium cobalt (SmCo), silver copper (AgCu), silver tin (AgSn), tantalum aluminum (TaAl), terbium dysprosium iron (TbDyFe), terbium iron alloy (TbFe), titanium aluminum (TiAl), titanium nickel (TiNi), titanium chromium (TiCr), tungsten rhenium (WRe), tungsten titanium (WTi), zirconium aluminum (ZrAl), zirconium iron (ZrFe), zirconium nickel (ZrNi), zirconium niobium (ZrNb), zirconium titanium (ZrTi), zirconium yttrium (ZrY), zinc aluminum (ZnAl) or zinc magnesium (ZnMg).

The nanostructured anode and cathode electrodes can respectively be formed by depositing at least one material directly on the nano-pitted substrate. The anode material and/or the cathode material can be deposited by sputter-coating, chemical vapor deposition or pulsed laser method, such as direct current sputter-coating, radio frequency sputter-coating, magnetron sputter-coating or reactive sputter-coating. Further, the anode material and/or the cathode material can be an oxide, polymeric, ceramic, mineral or metallic material. For example, the anode material can include carbon, silicon, graphite, a mixed metal oxide, hydroxyapatite, nichrome or graphite, or more particularly, tin oxide ($SnO_2$), zinc oxide, copper oxide, titanium oxide, titanium dioxide, vanadium pentoxide, magnesium oxide or silicon dioxide. The cathode material can be carbon, silicon, graphite, a copper oxide, graphite, a lithium-containing oxide, a phosphate, a fluorophosphate, a silicate, tin oxide, zinc oxide, titanium oxide, titanium dioxide, vanadium pentoxide, magnesium oxide, silicon dioxide, nichrome or hydroxyapatite, or more particularly, lithium cobalt oxide ($LiCoO_2$), tin oxide ($SnO_2$), $Li_4Ti_5O_{12}$, $Li_4Ti_5O_{12}$, zinc oxide, copper oxide, titanium oxide, titanium dioxide, vanadium pentoxide, magnesium oxide, silicon dioxide, nichrome, $Li_4Ti_5O_{12}$, $Li_4Ti_5O_{12}$, $LiNi_xCO_{1-2x}MnO_2$, $LiNi_{0.5}Mn_{1.5}O_4$, $Li(Ni_{0.8}CO_{0.15}Al_{0.05})O_2$, $LiMn_2O_4$, iron olivine ($LiFePO_4$), $LiFe_{1-x}MgPO_4$, $LiMoPO_4$, $LiCoPO_4$, $LiNiPO_4$, $Li_3V_2(PO_4)_3$, $LiVOPO_4$, $LiMP_2O_7$, $LiFe_{1.5}P_2O_7$, $LiVPO_4F$, $LiAlPO_4F$, $Li_5V(PO_4)_2F_2$, $Li_5Cr(PO_4)_2F_2$, $Li_2CoPO_4F$, $Li_2NiPO_4F$, $Li_2FeSiO_4$, $Li_2MnSiO_4$ or $Li_2VOSiO_4$.

BRIEF DESCRIPTION OF THE DRAWINGS

FIGS. 18A through 18D show SEM images of a nano-pitted aluminum substrate (top) before and (bottom) after deposition and removal of a tin oxide layer, with the pores at the bottom being approximately 20-40 nm in diameter;

Other advantages and features will be apparent from the following description and from the claims.

DETAILED DESCRIPTION OF THE INVENTION

The invention discussed herein is merely illustrative of specific manners in which to make and use this invention and are not to be interpreted as limiting in scope.

While the invention has been described with a certain degree of particularity, it is to be noted that many modifications may be made in the details of the construction and the arrangement of the devices and components without departing from the spirit and scope of this disclosure. It is understood that the invention is not limited to the embodiments set forth herein for purposes of exemplification.

Figure 1:
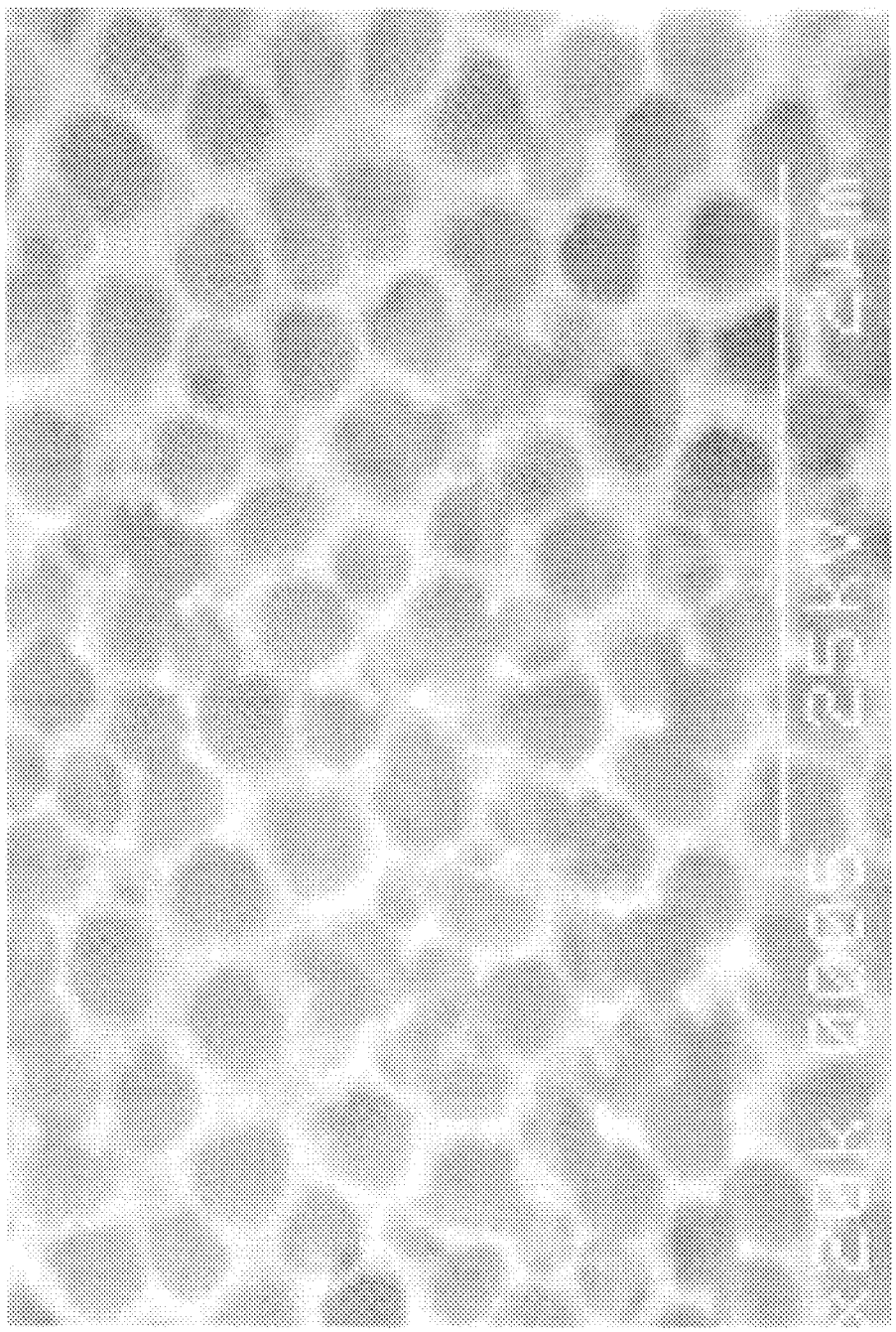
FIG. 1 illustrates an electron microscope photograph of a stage in the process of the fabrication of nanobaskets by sputter deposition on porous substrates disclosed herein.
Figure 2:
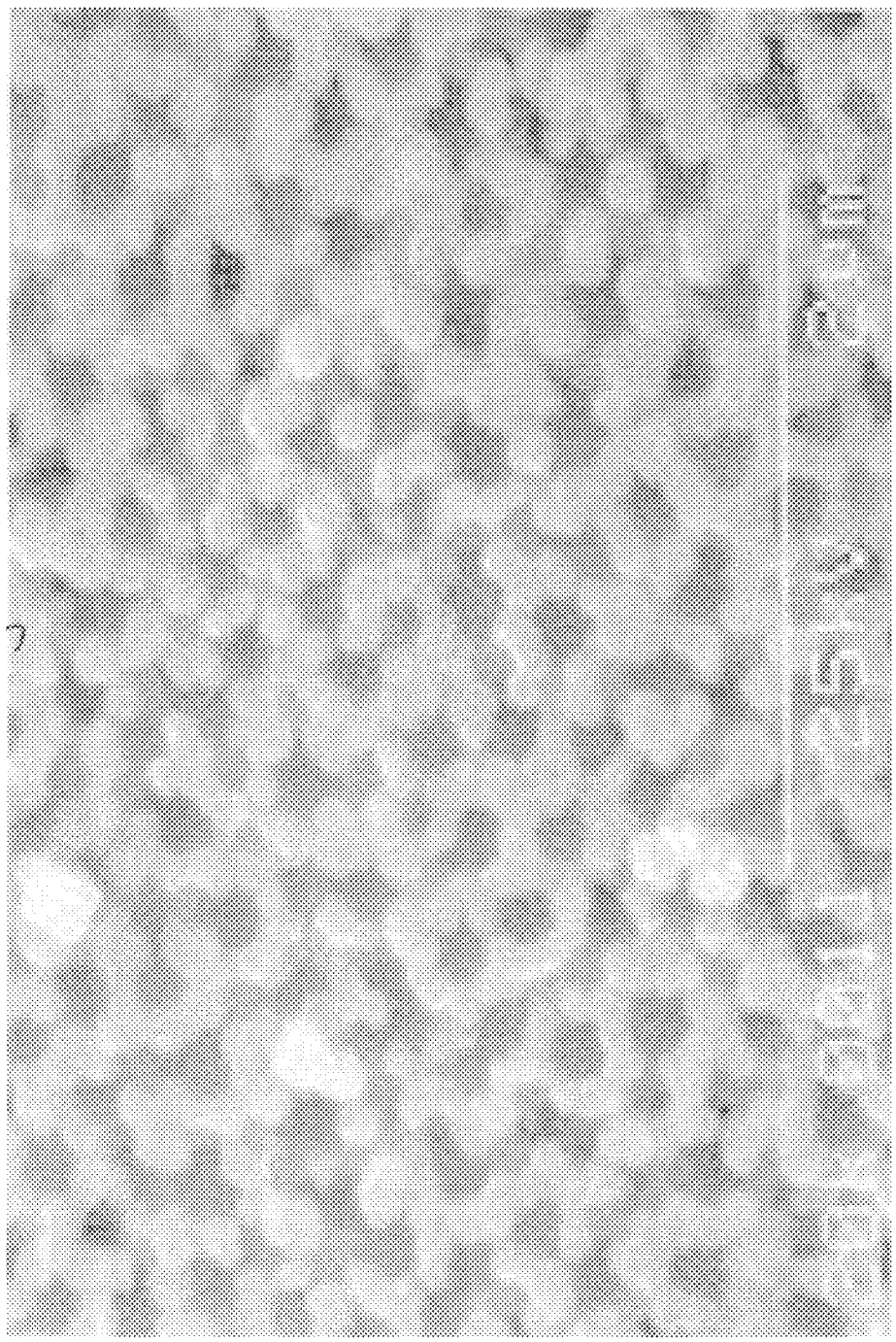
FIG. 2 illustrates a sequential stage in the process subsequent to that shown in FIG. 1.
Figure 3:
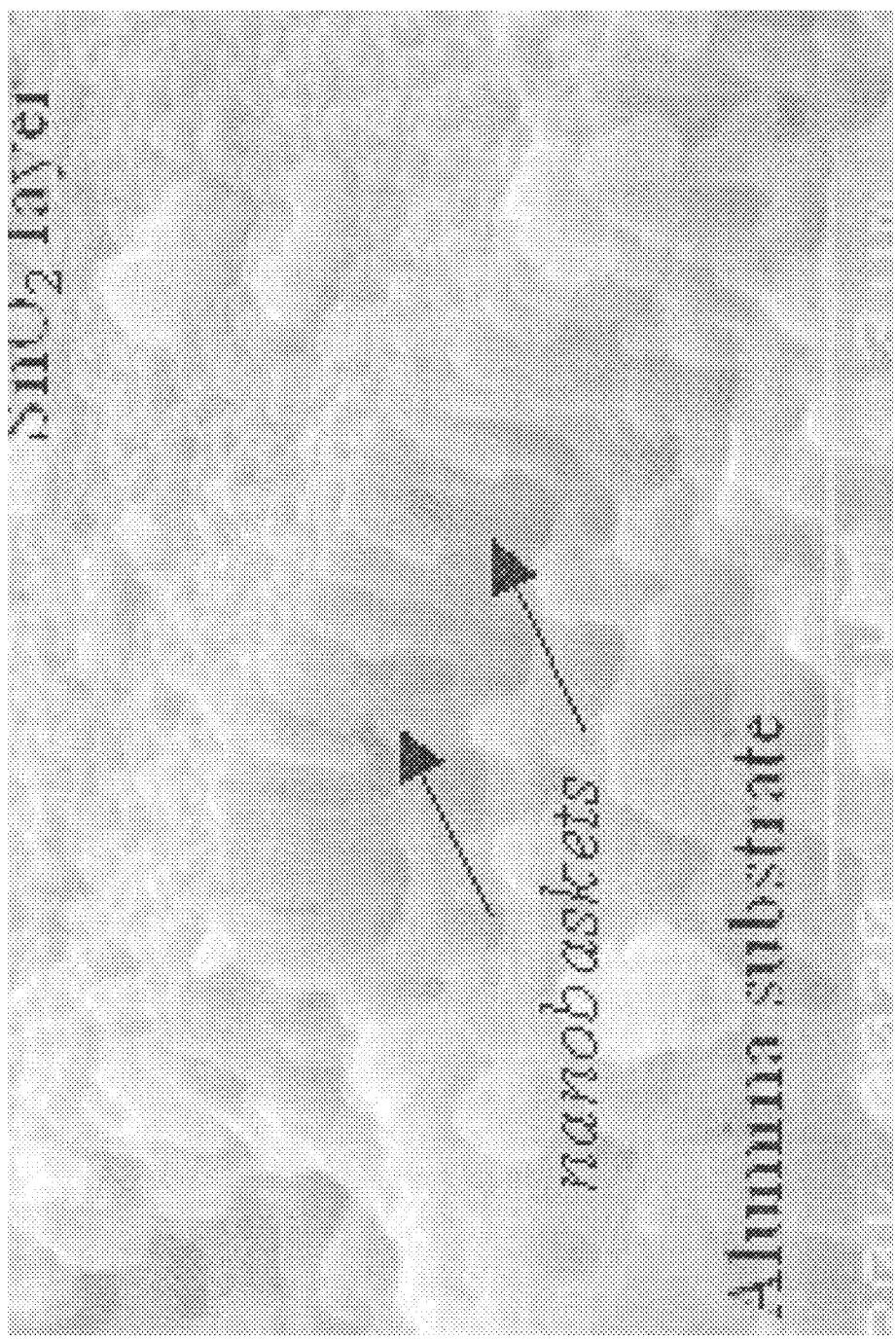
FIG. 3 illustrates a partial, sectional view of an electron microscope photograph of a further subsequent stage of the process.
Figure 8:
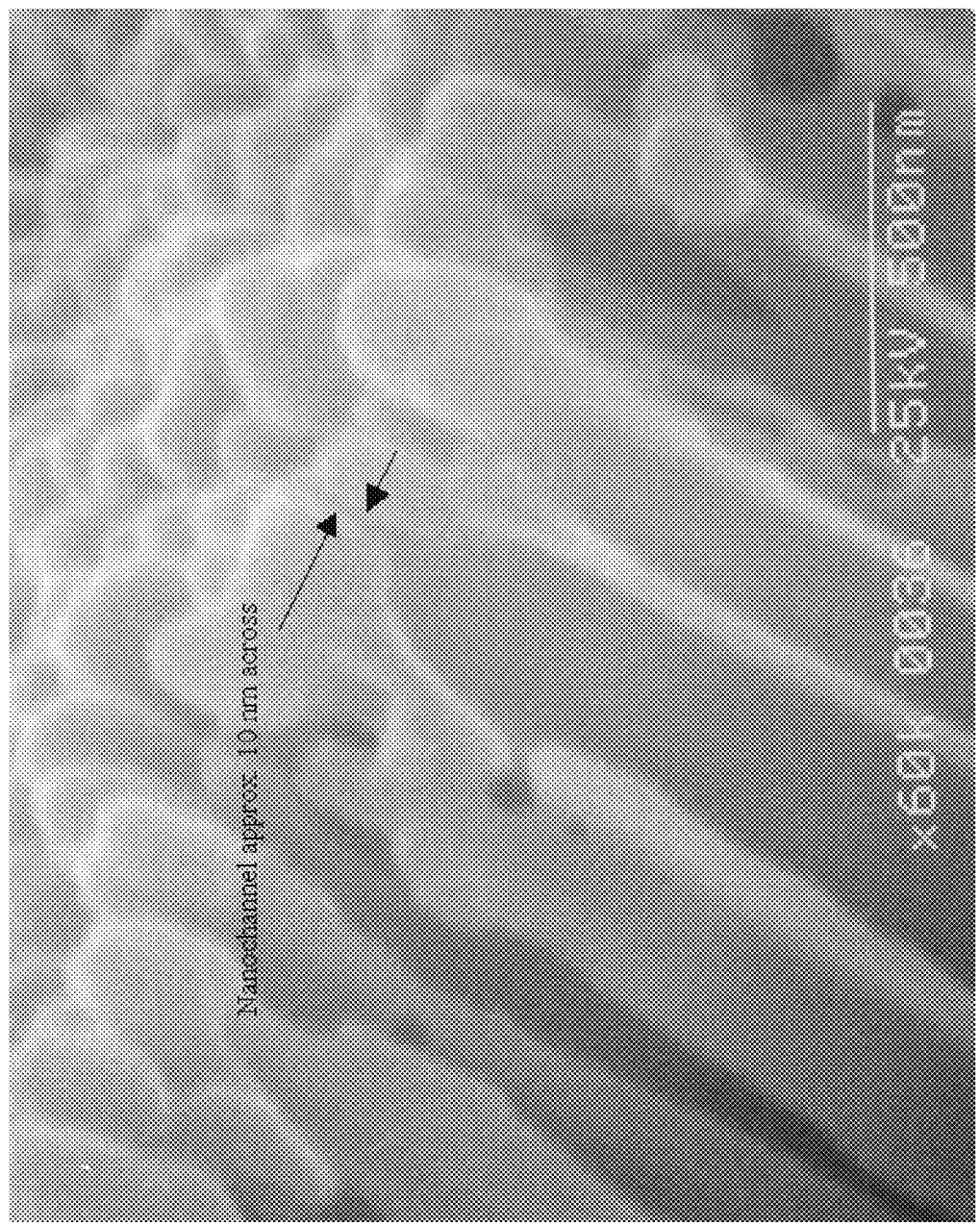
FIG. 8 illustrates an electron microscope photograph of a sectional view of a partially capped nanobasket in accordance with an illustrative embodiment of the fabrication of nanobaskets by sputter deposition on porous substrates disclosed herein.
Figure 9:
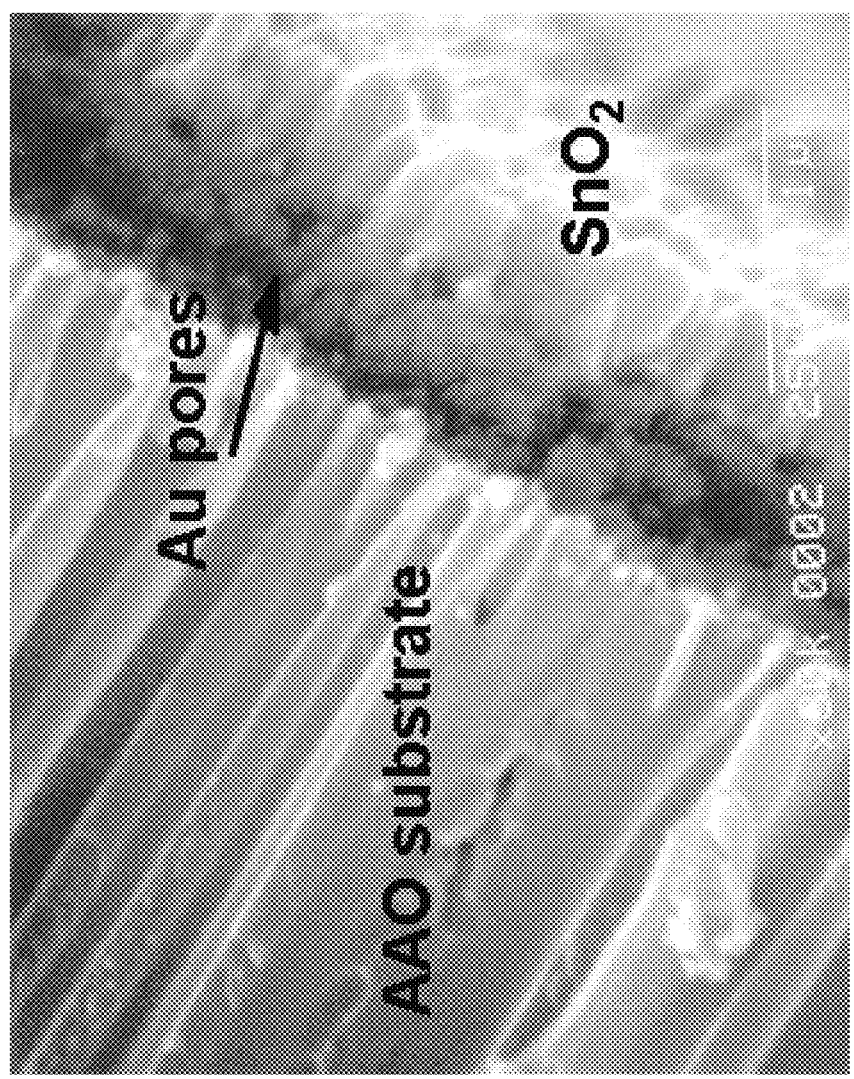
FIG. 9 illustrates an electron microscope photograph of a capped nanobasket utilizing multiple compositions to create a layered structure in accordance with an illustrative embodiment of the fabrication of nanobaskets by sputter deposition on porous substrates disclosed herein.
Figure 14:
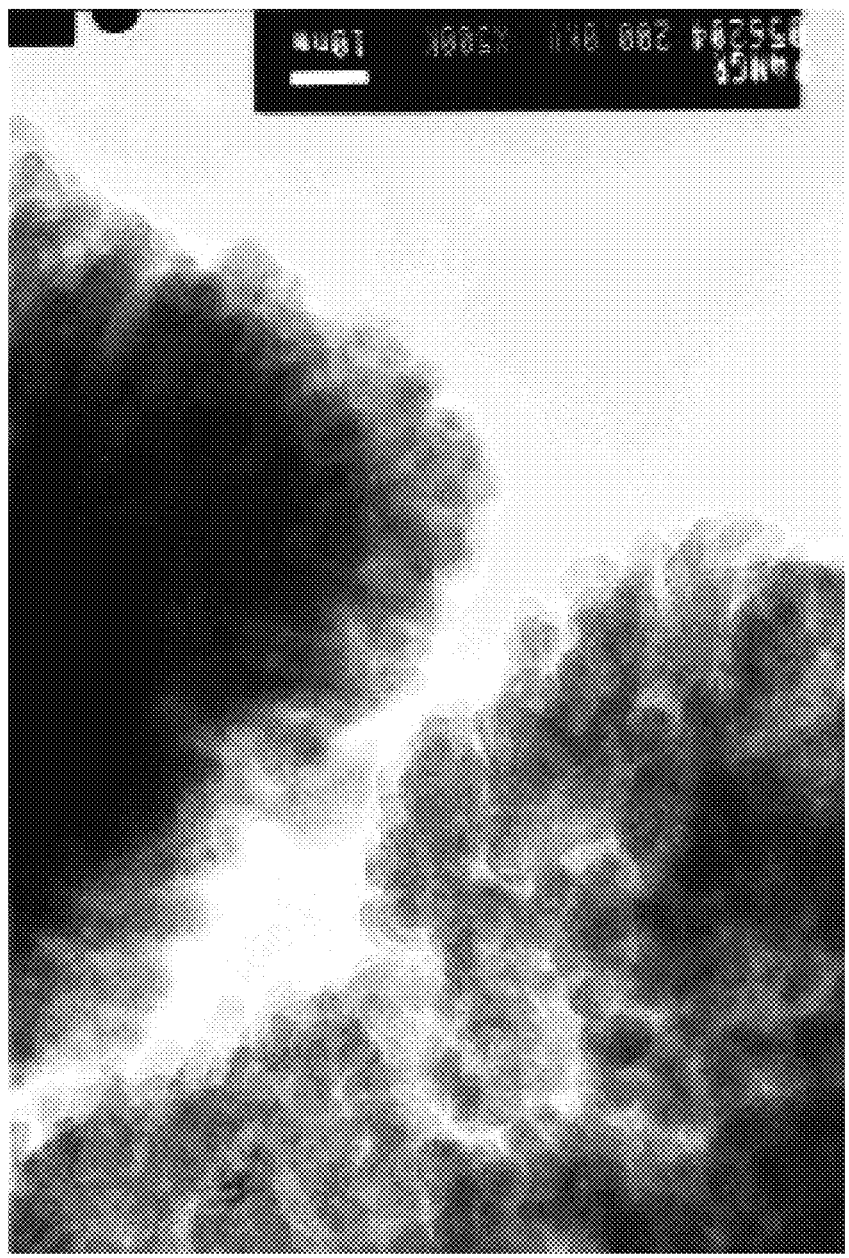
FIG. 14 illustrates a transmission electron microscope photo of the grains composing the nanobasket in accordance with an illustrative embodiment of the fabrication of nanobaskets by sputter deposition on porous substrates disclosed herein.
Figure 15:
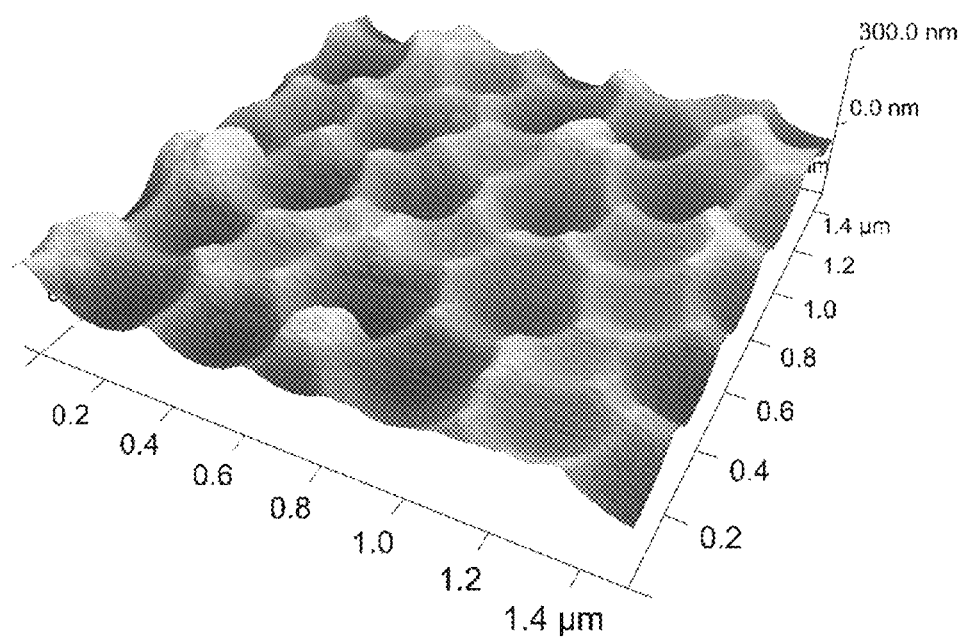
FIG. 15 shows an atomic force microscope (AFM) image of a nano-pitted aluminum surface in accordance with an illustrative embodiment of the nanopatterned substrate that serves as both a current collector and template for nanostructured electrode growth disclosed herein.
Figure 16A:
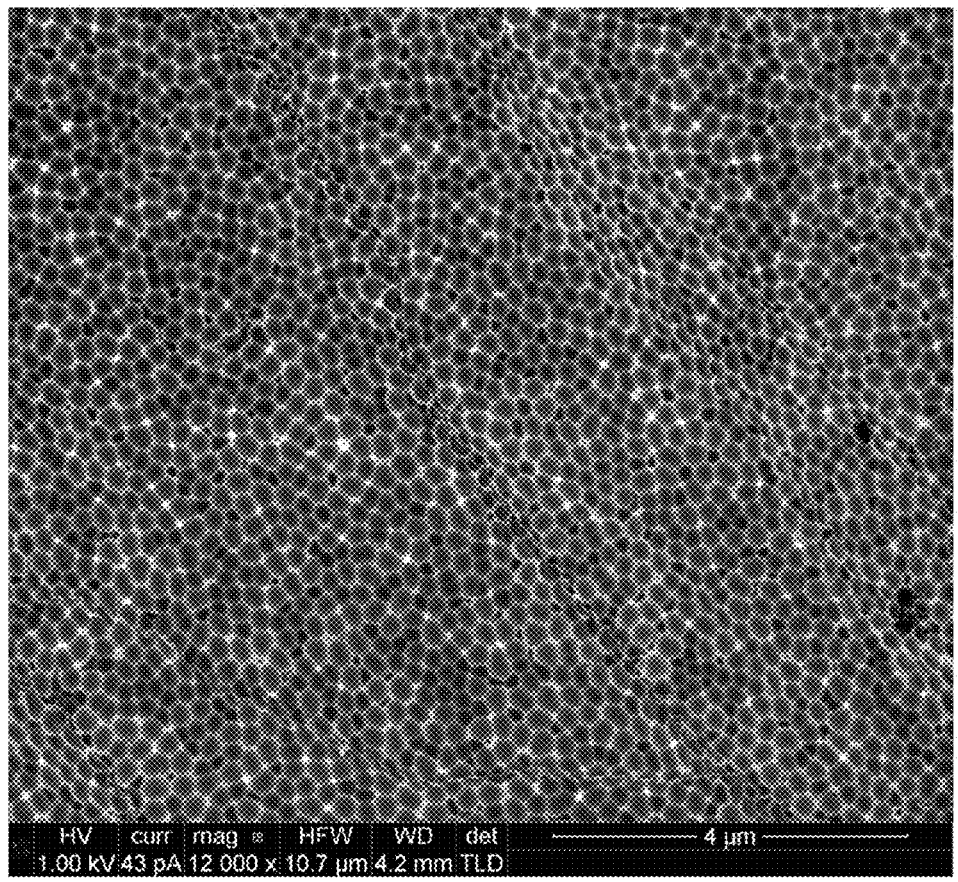
FIGS. 16A and 16B show SEM images of 200 nm pits in the nano-pitted aluminum surface shown in FIG. 17.
Figure 16B:
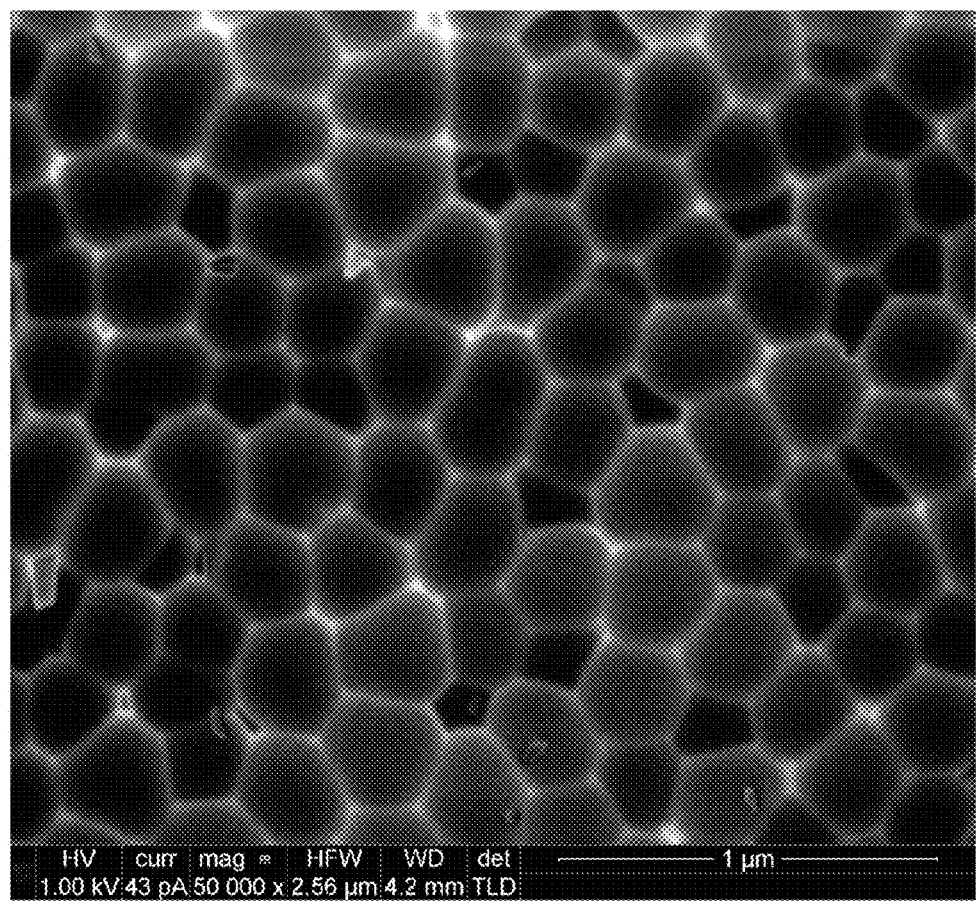
Figure 17A:
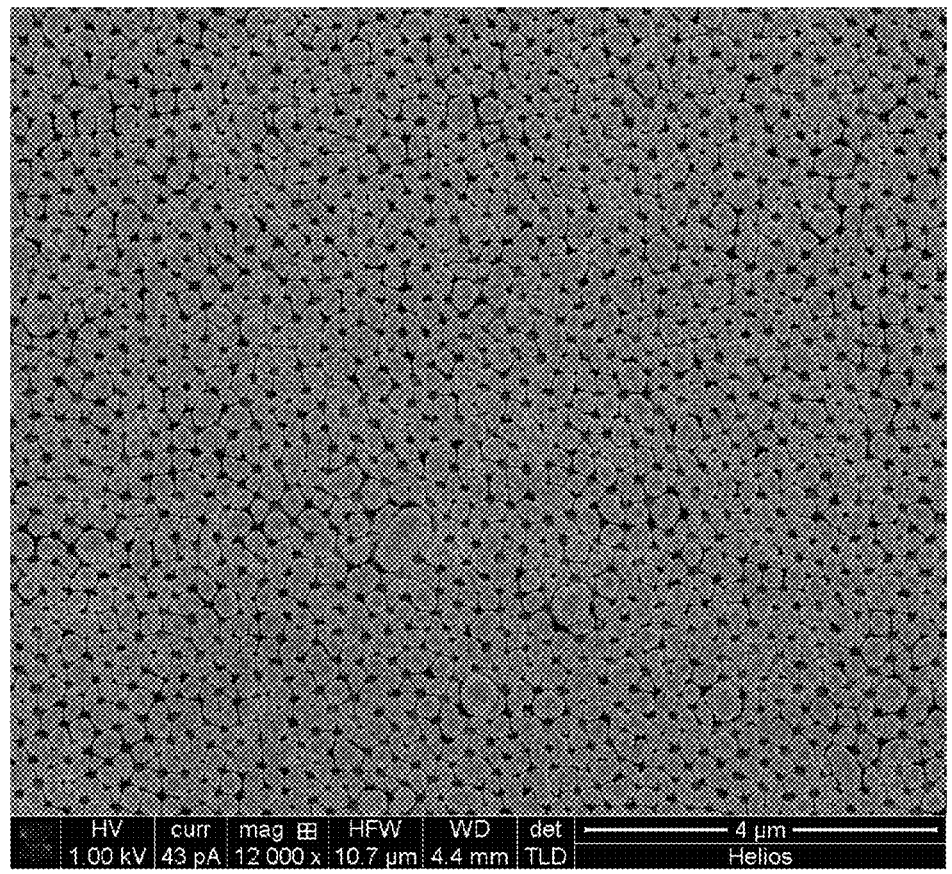
FIGS. 17A and 17B show SEM images of 400 nm of $SnO_2$ electrode sputtered over a nano-pitted aluminum substrate in accordance with an illustrative embodiment of the nanopatterned substrate that serves as both a current collector and template for nanostructured electrode growth disclosed herein.
Figure 17B:
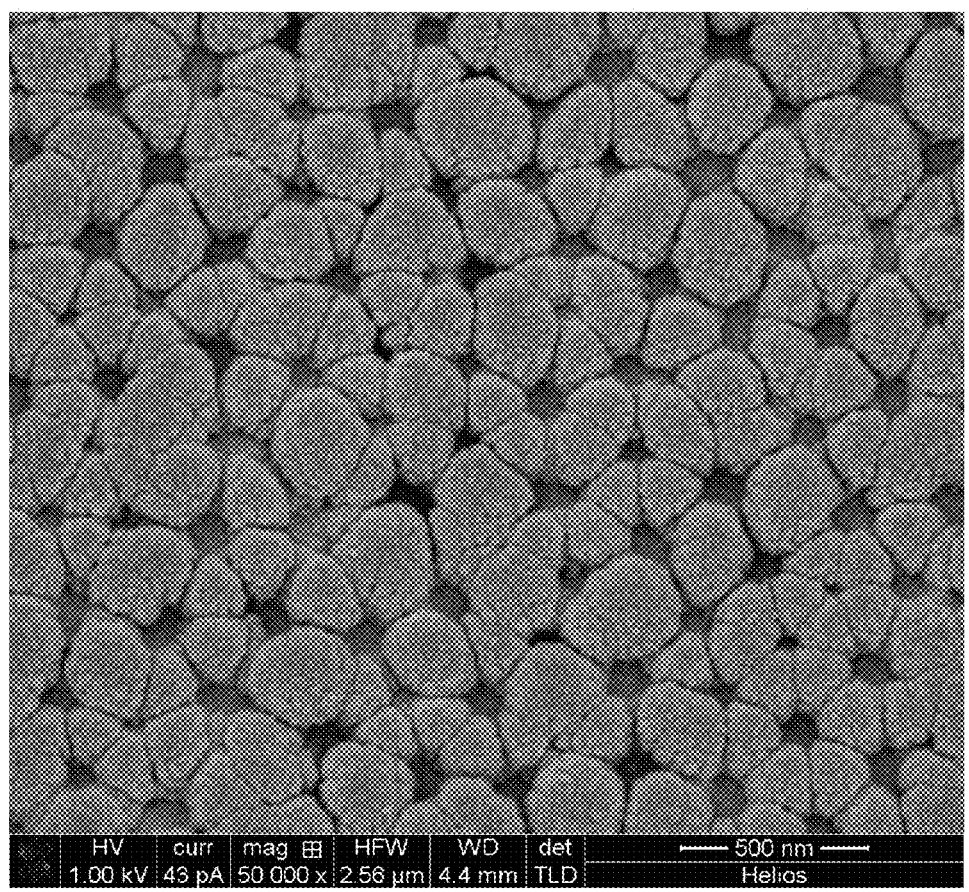

Referring to the figures of the drawings, wherein like numerals of reference designate like elements throughout the several views, and initially to FIG. 1 illustrating an electron microscope photograph of a stage in the process of the formation of a nanostructured electrodes that includes capped nanotubes, termed "nanobaskets" by a sputter-coating method on a porous substrate as the template for the nanostructured electrodes. FIG. 2 illustrates an electron microscope photograph of approximately 400 nanometers of tin oxide sputtered onto an alumina substrate. It will be observed that the material is beginning to cap or close over. FIG. 3 illustrates an electron microscope photograph of a partial cross-section of the photo shown in FIG. 2. The alumina substrate may be viewed with the tin oxide sputtered thereon to form the nanostructured electrodes. FIG. 8 is an electron microscope photograph that shows that as the nanostructured electrodes begin to cap over, very small nano-channels are formed, which have potential applications in the trapping of molecular species, confinement of DNA and RNA, specialized filtrations, and chromatographic analysis. This is an example of a "partially capped" nanostructured electrode. Partially capped nanostructured electrodes are created by stopping the sputtering process before the walls of the nanostructured electrodes have grown together to form a continuous cap. FIG. 9 illustrates an electron microscope photograph of capped nanostructured electrodes utilizing multiple compositions to create a layered structure. FIG. 14 shows the nano-grains that compose the walls and cap of the nanostructured electrodes. The fact that the nanostructured electrodes contain a substructure of nano-grains is expected to further enhance the performance of the nanostructured electrodes. FIGS. 16 through 18 show SEM images of 200 nm pits in a nano-pitted metal substrate and of nanostructured electrodes grown directly on the substrate.

The nanostructured electrodes can be formed using sputter-coating techniques, including but not limited to, DC sputter-coating, RF sputter-coating and RF magnetron sputter-coating. Chemical reactive sputtering could also be used to form the nanostructured electrodes. In addition, the nanostructured electrodes could also be formed using chemical vapor deposition or pulsed laser methods.

At the surface of the nanostructured or nano-pitted substrate, the pores have a continuous edge, which could be of any relative geometric configuration. As a target material is sputter-coated, nanoscale clusters of the material collect preferentially on the continuous edge of the pores of the underlying substrate. As the process of depositing material continues, a gradual build-up of "walls" effectively extends the pore structure with the target material to form a nanotube. The pore size of these nanotubes is dependent on the substrate's original pore structure and, therefore, their diameter can be varied by using substrates of varying pore sizes.

As the sputter-coating process is continued, the walls grow thicker as they grow taller so that they will eventually touch, capping over the pore spaces with deposited material to form the base or end of a nanostructured electrode. Depending on the parameters used in the sputter-coating process, such as plasma gas concentration, power, target materials, and underlying substrate, the pores can be made to cap at various lengths or heights from the substrate surface, ranging from tens to hundreds of nanometers.

The substrate could be made from numerous materials whose surface energy values are such that they are conducive to the formation of nanostructured electrodes. In one example, a substrate has a plurality of pores that range between ten (10) micrometers to one (1) nanometer (nm) in diameter. Various substrates could be used, e.g., either polymeric (such as polycarbonate), ceramic material (such as alumina oxide ($Al_2O_3$)), silicon or metallic porous structures (such as aluminum (Al), antimony (Sb), bismuth (Bi), boron (B), cadmium (Cd), carbon (C), cerium (Ce), chromium (Cr), cobalt (Co), copper (Cu), dysprosium (Dy), erbium (Er), europium (Eu), gadolinium (Gd), germanium (Ge), gold (Au), graphite (C), hafnium (Hf), holmium (Ho), indium (In), iridium (Ir), iron (Fe), lanthanum (La), lutetium (Lu), magnesium (Mg), manganese (Mn), molybdenum (Mo), neodymium (Nd), nickel (Ni), niobium (Nb), palladium (Pd), platinum (Pt), praseodymium (Pr), rhenium (Re), ruthenium (Ru), samarium (Sm), selenium (Se), scandium (Sc), silver (Ag), silicon (Si), tantalum (Ta), terbium (Tb), thulium (Tm), tin (Sn), titanium (Ti), tungsten (W), vanadium (V), ytterbium (Yb), yttrium (Y), zirconium (Zr) or zinc (Zn)), metal alloy porous structures (such as aluminum copper (AlCu), aluminum chromium (AlCr), aluminum magnesium (AlMg), aluminum silicon (AlSi), aluminum silver (AlAg), cerium gadolinium (CeGd), cerium samarium (CeSm), chromium silicon (CrSi), cobalt chromium (CoCr), cobalt iron (CoFe), cobalt iron boron (CoFeB), copper cobalt (CuCo), copper gallium (CuGa), copper indium (CuIn), copper nickel (CuNi), copper zirconium (CuZr), hafnium iron (HfFe), iron boron (FeB), iron carbon (FeC), iron manganese (FeMn), iridium manganese (IrMn), iridium rhenium (IrRe), indium tin (InSn), molybdenum silicon (MoSi), nickel aluminum (NiAl), nickel chromium (NiCr), nickel chromium silicon (NiCrSi), nickel iron (NiFe), nickel niobium titanium (NiNbTi), nickel titanium (NiTi), nickel vanadium (NiV), samarium cobalt (SmCo), silver copper (AgCu), silver tin (AgSn), tantalum aluminum (TaAl), terbium dysprosium iron (TbDyFe), terbium iron alloy (TbFe), titanium aluminum (TiAl), titanium nickel (TiNi), titanium chromium (TiCr), tungsten rhenium (WRe), tungsten titanium (WTi), zirconium aluminum (ZrAl), zirconium iron (ZrFe), zirconium nickel (ZrNi), zirconium niobium (ZrNb), zirconium titanium (ZrTi), zirconium yttrium (ZrY), zinc aluminum (ZnAl) or zinc magnesium (ZnMg)), among others, could also be used. The nanoporous substrate could be created by laser ablation, a chemical etching process, an electrochemical process, track etching, micro- or nano-lithography, contact lithography, X-ray-beam lithography, electron-beam lithography, ion-beam lithography, photolithography, nano-imprint lithography, chemical self-assembly or by other methods.

Figure 19:
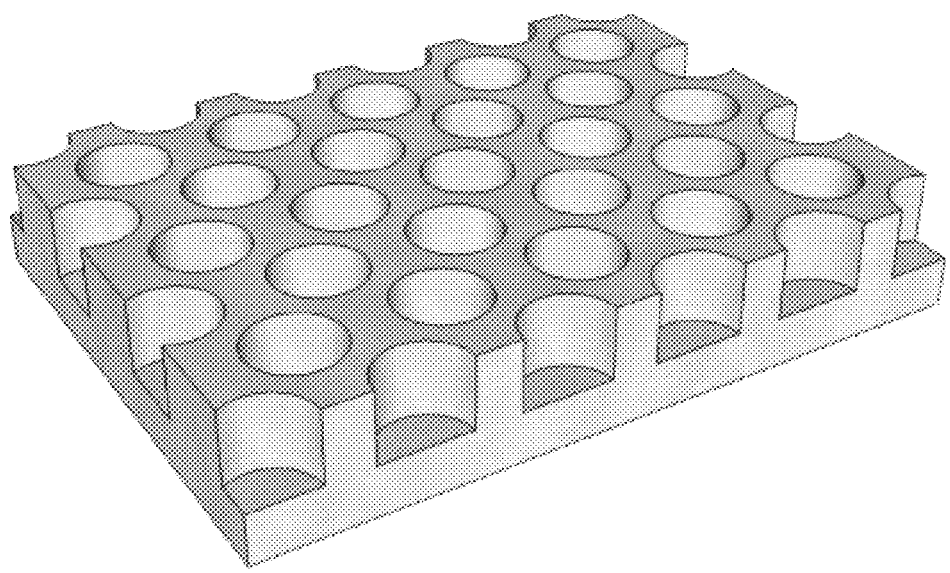
FIG. 19 illustrates an example of a nano-pitted metal film serving as both current collector and growth substrate for nanostructured electrodes.
Figure 20:
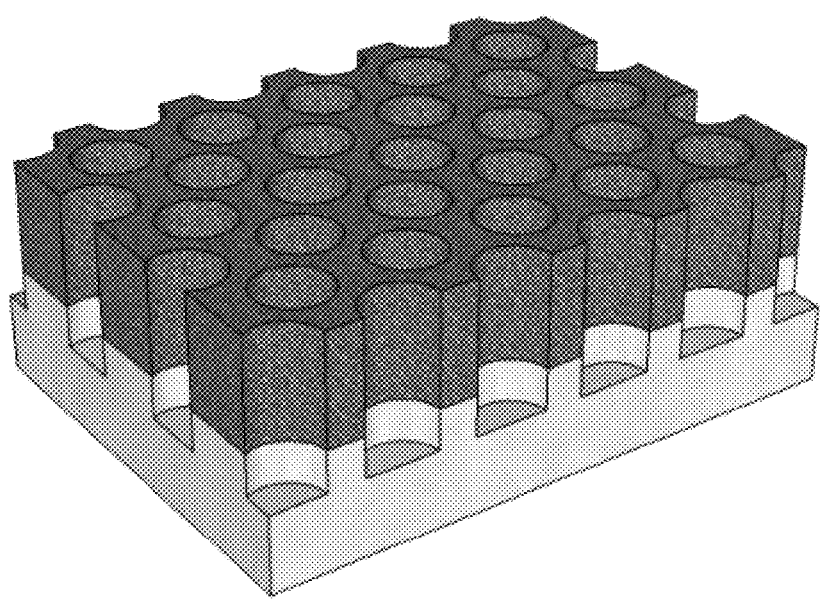
FIG. 20 illustrates and example of nanostructured electrodes grown on the nano-pitted metal film of FIG. 19 that maintains the nanostructure.

For example, a nanoporous anodized aluminum oxide (AAO) substrate could be prepared by applying an electrical potential to an aluminum sheet while in an aqueous acid solution and then electro-polishing the surface. In particular, AAO synthesis is accomplished by assembling an electro-chemical cell with a sheet of polished high-purity aluminum as the anode, graphite or steel as the counter electrode and an acidic electrolyte (usually oxalic, phosphoric, or sulfuric acid). When a potential is applied across the cell, aluminum oxide is formed at the surface of the aluminum sheet, and under certain conditions the oxide layer forms well-ordered pores in a hexagonal pattern. The pores self-assemble during anodization due to competition between two processes: the formation of alumina at the oxide/aluminum interface, and the dissolution of the alumina at the oxide/electrolyte interface. As the aluminum oxide grows, the aluminum is removed from the aluminum substrate leaving a nano-pitted surface having pores that match the arrangement of pores in the oxide layer. The aluminum metal layer is removed once the oxide has reached the desired thickness. The AAO substrate can then be used as a growth template for nanostructured electrodes, or as illustrated in FIGS. 19 and 20, the nano-pitted aluminum substrate can directly serve as both the growth template and current collector for the nanostructured electrodes.

The processes and methods disclosed herein are robust and can be utilized with various materials for making the nanostructure electrodes. For example, copper oxide electrodes are of importance in catalytic operations, while metal alloys, such as nichrome, are useful for the manufacture of thermal devices. Other materials such as hydroxyapatite, the mineral closest in composition to bone, are amenable to this technique and have been observed to form nanobaskets. These materials may have important applications as bone mimics and tissue scaffolding. In addition, anode materials could be graphite, $SnO_2$, silicon, $Li_4Ti_5O_{12}$, $Li_4Ti_5O_{12}$, or any other suitable anode material. Cathode materials could include lithium-containing oxides, such as lithium cobalt oxide ($LiCoO_2$), mixed metal oxides, such as $LiNi_xCO_{1-2x}MnO_2$, $LiNi_{0.5}Mn_{1.5}O_4$, $Li(Ni_{0.8}Co_{0.15}Al_{0.05})O_2$, $LiMn_2O_4$; phosphates, such as iron olivine ($LiFePO_4$) and it is variants such as $LiFe_{1-x}MgPO_4$, $LiMoPO_4$, $LiCoPO_4$, $LiNiPO_4$, $Li_3V_2(PO_4)_3$, $LiVOPO_4$, $LiMP_2O_7$, or $LiFe_{1.5}P_2O_7$; fluorophosphates, such as $LiVPO_4F$, $LiAlPO_4F$, $Li_5V(PO_4)_2F_2$, $Li_5Cr(PO_4)_2F_2$, $Li_2CoPO_4F$, or $Li_2NiPO_4F$; silicates, such as $Li_2FeSiO_4$, $Li_2MnSiO_4$, or $Li_2VOSiO_4$, or any other suitable cathode material.

The fabrication processes disclosed herein also allow the formation of nanostructured electrodes composed of multiple compositions. The ability to create layered electrodes directly on a nanostructure or nano-pitted metal substrate allows for the straightforward and easy assembly of nanodevices using appropriate selections of materials, such as current collectors, electrodes, and semiconductors or layered semiconductors. A layered nanobasket system may made by sputtering a first material, but stopping the sputtering at some desired point before the walls have grown thick enough to form a cap. A second material can then be sputtered atop the first, continuing to extend the walls of the baskets upward. Sputtering of this second material can continue until capping occurs, or it can also be stopped at a desired point before the walls have grown together, and more layers can be added. The number of layers possible is dependent upon the materials and pore sizes used. The nanobasket structures and/or layers within them may be made from doped elements or compounds; for example, $SnO_2$ doped with Indium.

In addition, a thin layer of liquid electrolyte or a thin layer of solid electrolyte can be utilized. The liquid electrolyte could be aqueous or non-aqueous in nature. A solid electrolyte could include oxides, ceramics or polymer electrolytes. The thin layer could be placed on the electrodes by several methods, including but not limited to DC sputter coating, RF magnetron sputter coating, vapor deposition, spin coating and chemical self-assembly to form molecular level layers. Liquids and solutions could also be placed between the two electrode layers by placing micro- or nanoparticle insulation spacers between the two electrode structures and allowing capillary action to pull the liquids or solvents between the two electrodes. These spacers could be placed on one or both electrode surfaces, such as by dusting the surface with insulating micro- or nanoscale particles that would serve as the spacers, and then the two electrodes would be placed together. Dispersed insulating particles on the electrode surface would prevent the two electrodes from making direct contact and would leave a thin continuous void that the electrolyte could fill. Exposure of an edge of the two electrodes separated by the spacers to a liquid or solution would draw the liquid or solution into the thin void, thereby filling this space with electrolyte. The insulating spacer particles could be dispersed in the liquid or solution for placement. In this method, the solution or liquid could be placed on the electrode surface by solvent casting, spin coating or other techniques. The two electrodes would be placed together with the solvent and spacers already on one or both electrodes trapping the electrolyte between the two electrodes. Direct electrode contact would again be prevented by the spacers on the electrode surface. The liquid could be any aqueous or non-aqueous electrolyte. The solvent could contain a dissolved polymer and inorganic salts. With this solution, the solvent maybe evaporated leaving a polymer electrolyte between the two electrodes.

In whatever means the thin layer of electrolyte is placed or deposited between the two electrode surfaces to complete a nanobattery system, the electrolyte will take advantage of the enhanced surface area of each electrode surface. The electrolyte will disperse itself into the fissures and crevices between the nanobasket structure, and onto the roughened nanostructure of the top surface of the nanobaskets taking advantage of the enhanced electrode surface area.

Example 1

An AAO substrate is placed on the sample stage of an RF-magnetron sputtering system which is fitted with a tin oxide ($SnO_2$) target. A chamber is filled and flushed with argon gas, and sputtering is initiated under system conditions of 0.01 mbar argon pressure and 35 watts forward power. In accordance with the generally recognized principles of sputter depositions, $SnO_2$ is removed from the target and deposited onto the AAO substrate. Film thickness is monitored using a quartz crystal thickness monitor. When the desired thickness is reached, turning off the power halts the sputtering process.

Example 2

An AAO substrate is placed on the sample stage of an RF-magnetron sputtering system which is fitted with a gold (Au) target. The chamber is filled and flushed with argon, and sputtering is initiated under system conditions of 0.01 mbar argon pressure and 35 watts forward power. In accordance with the generally recognized principles of sputter depositions, gold is removed from the target and deposited onto the AAO substrate. Film thickness is monitored using a quartz crystal thickness monitor. When the desired thickness is reached, sputtering is halted and the chamber is opened. A new target of $LiCoO_2$ is installed. The chamber is again filled and flushed with argon, and sputtering is initiated under system conditions of 0.01 mbar argon pressure and 35 watts forward power. $LiCoO_2$ is removed from the target and deposited onto the gold layer previously deposited on the AAO substrate. Film thickness is monitored using a quartz crystal thickness monitor. When the desired thickness is reached, turning off the power halts the sputtering process.

Figure 4:
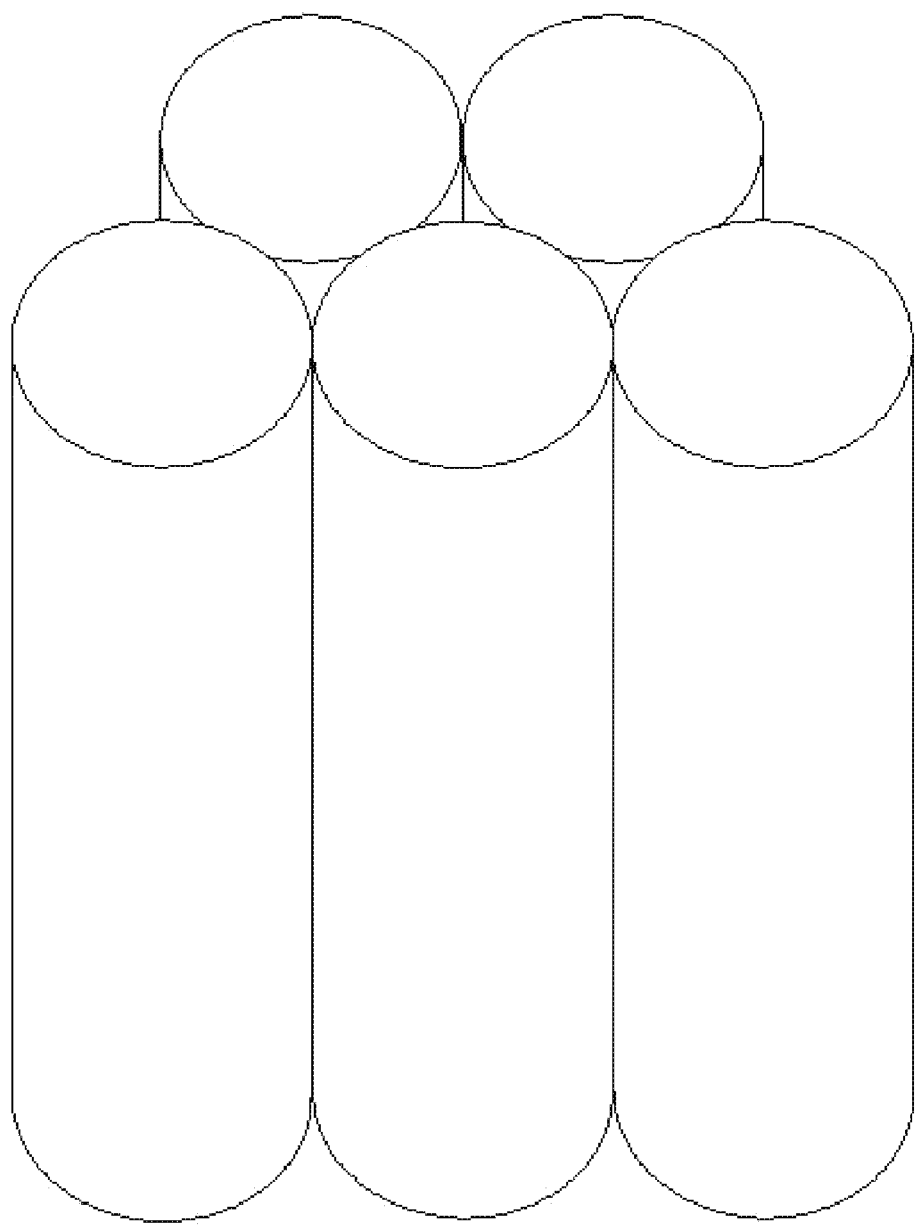
FIG. 4 illustrates a simplified, diagrammatic view an example of capped tubes utilizing multiple compositions to create a layered structure in accordance with an illustrative embodiment of the fabrication of nanobaskets by sputter deposition on porous substrates disclosed herein.
Figure 5:
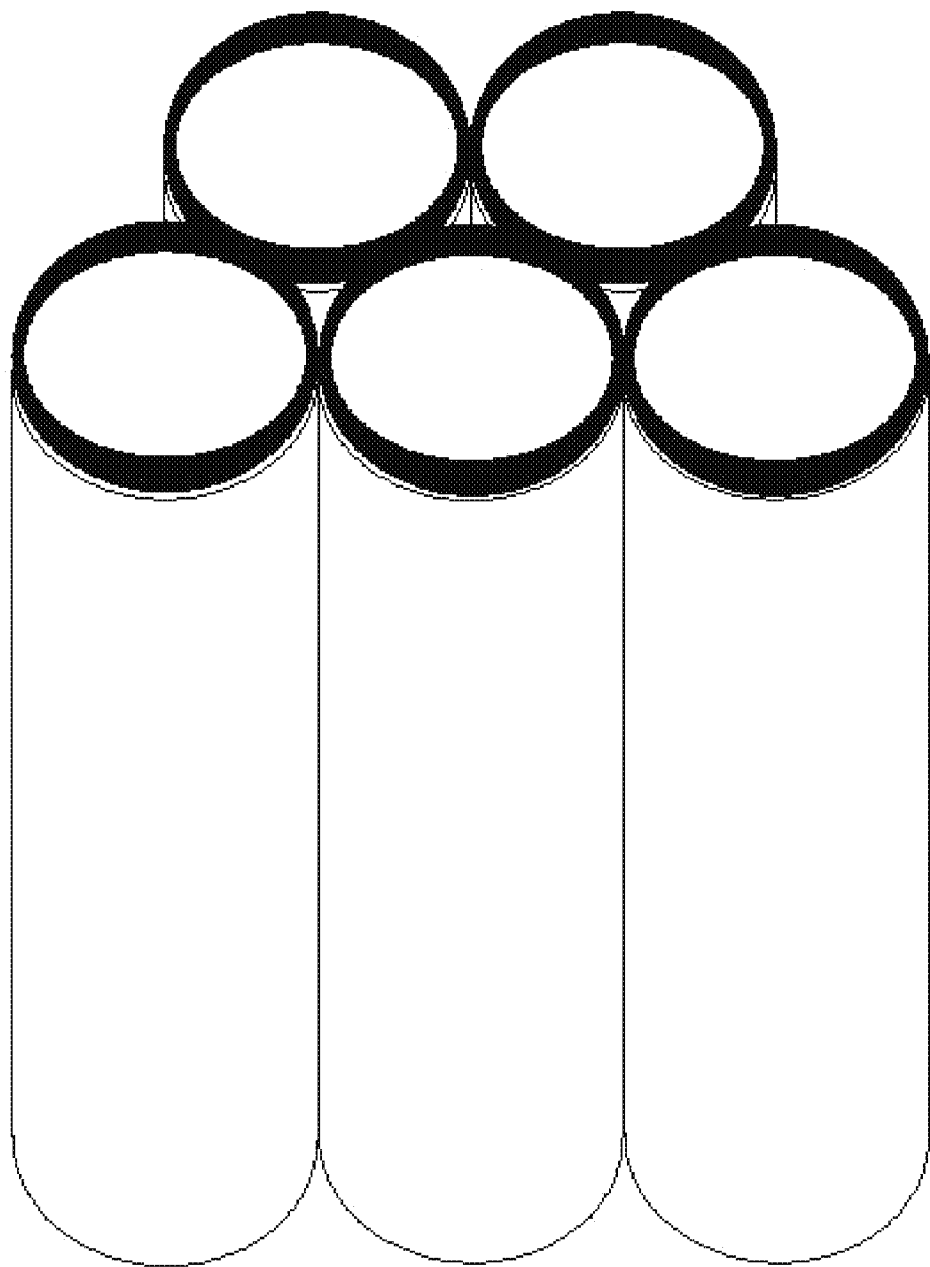
FIGS. 5, 6 and 7 illustrate subsequent, sequential stages in the formation of capped tubes of multiple compositions shown in FIG. 4.
Figure 6:
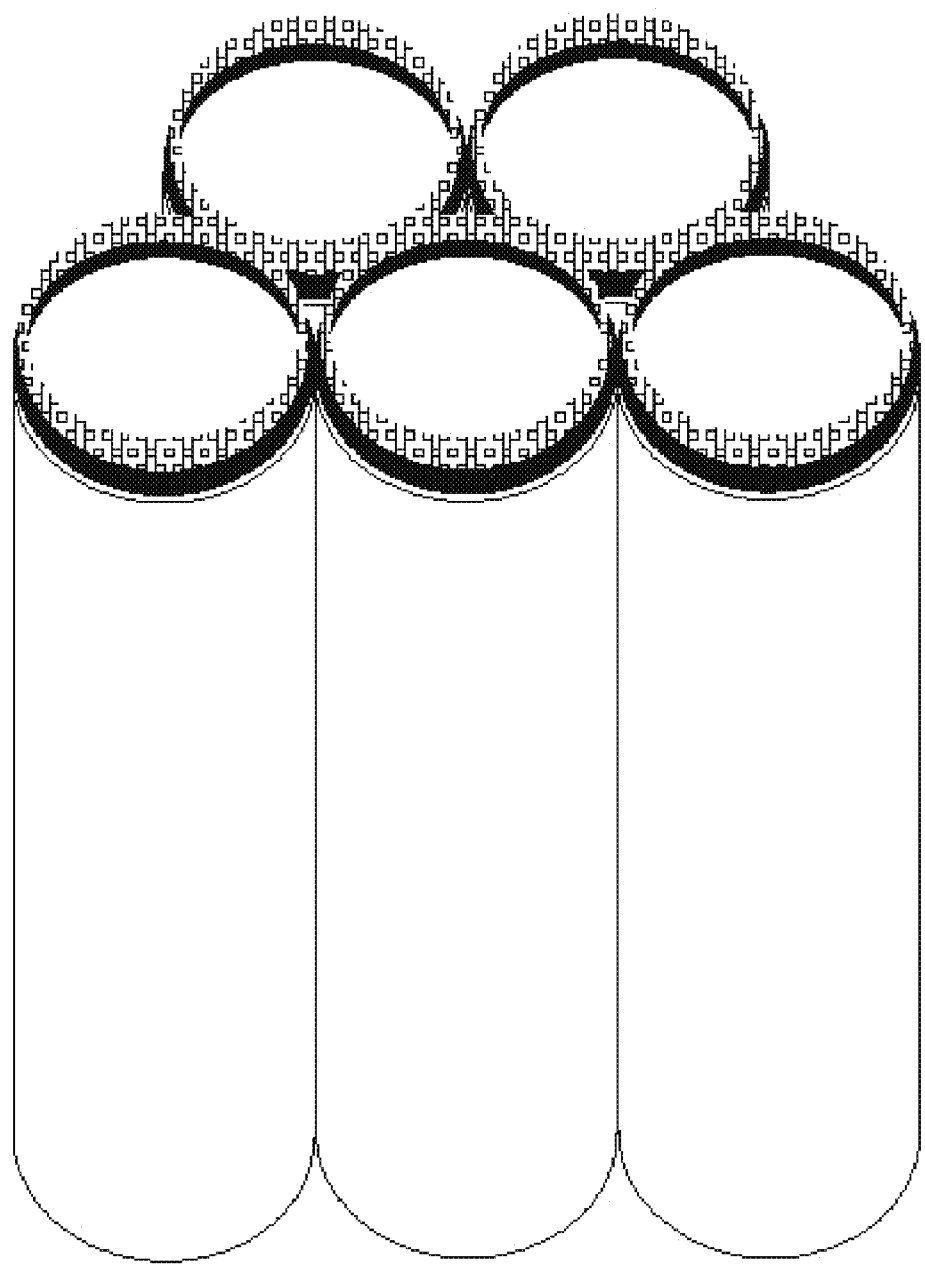
Figure 7:
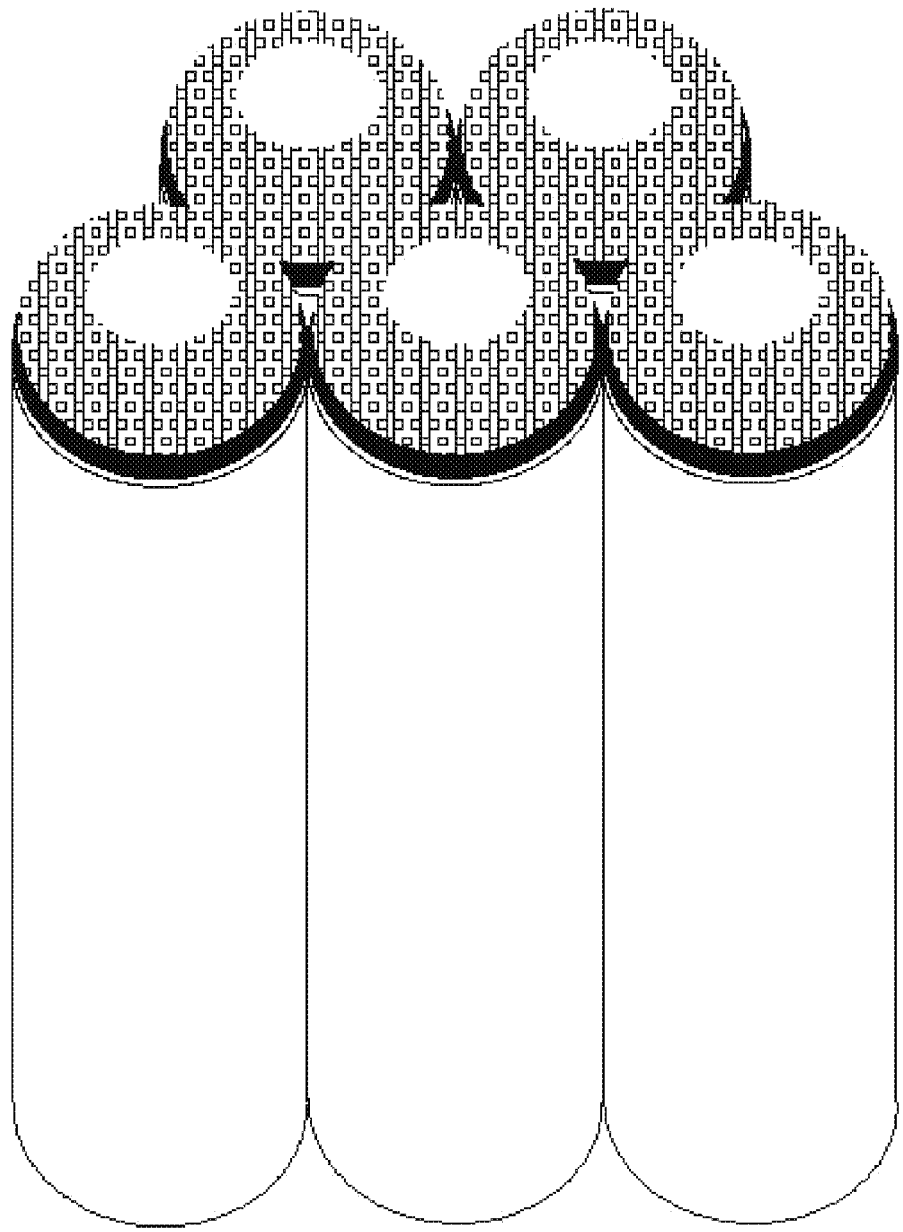

FIGS. 4, 5, 6 and 7 illustrate simplified diagrammatic views of the sequential fabrication of capped nanostructures by sputter deposition utilizing multiple compositions. FIG. 4 illustrates the pores of the substrate prior to application of any sputter deposition. FIG. 5 illustrates use of sputter deposition techniques to apply a metallic deposit onto the edges or open ends of the nanotube structures. FIGS. 5, 6 and 7 illustrate the sequential application of a metallic oxide onto the metal layer previously deposited on the nanotube structure. Continued application of the metallic oxide results in the capping over of the tubes.

Example 3

A nanostructured metal substrate was formed by chemical polishing of an aluminum film in concentrated phosphoric acid for 5 minutes and then rinsed. The aluminum film was then placed into electrochemical cell with 0.3 M oxalic acid electrolyte solution at near 4° C., and a potential of 40 V was applied for 1 hour. The 40 V potential was then decreased in steps of 2 $Vmin^{-1}$ until the potential reached 2 V. Then, pores were widened by etching in phosphoric acid to form a nano-pitted aluminum substrate that can serve as both a growth template for nanostructured materials and as a current collector for the resulting nanostructured material.

The potential factors in controlling the dimensions of the pits in the nano-pitted aluminum substrate include oxidation voltage, time of oxidation, temperature and concentration of the oxalic acid electrolyte, and the electrochemical conditions of the step-down potential oxide layer dissolution procedure.

The results of the above procedure are shown in FIG. 18. The surface of the aluminum foil after polishing is shown for comparison in the top panes of FIG. 18. After the oxidation and step-down voltage procedure, the sample was etched in phosphoric acid in order to dissolve the remainder of the oxide layer. SEM imagery in the bottom panes of FIG. 18 show that the surface of the aluminum is covered with a very regular pattern of pores with diameters ranging from 20 to 40 nm. While this is smaller than the desired pore diameter of 200 nm, a refinement of this procedure should produce the desired 200 nm diameter pores.

Example 4

Nanostructured films of tin oxide were deposited directly on nano-pitted aluminum substrates, such as those fabricated above in Example 3, by radio frequency (RF) magnetron sputtering from a $SnO_2$ target in an argon atmosphere, utilizing a Cressington® 208 sputter coater with Manitou® power source. The pits in the aluminum substrate were approximately 200 nm in diameter and approximately 150 nm deep. Sputtering was performed at room temperature under approximately 0.01 mbar of argon pressure, with a spacing of 7 cm between the target and the sample. As can be seen in FIGS. 17 and 18, the growth of $SnO_2$ columns begins along the edges of the pits. The holes in the $SnO_2$ structures are the bottom of the pits in the aluminum metal. In these figures, the SnO2 columns have been deposited by sputtering so that their height from the surface is approximately 300 nm to approximately 400 nm. Deposition by sputtering more material will make the columns taller providing more surface area for applications such as battery electrodes. This nanostructured electrode, in this case $SnO_2$, is directly in contact with the aluminum current collector.

Example 5

Figure 10:
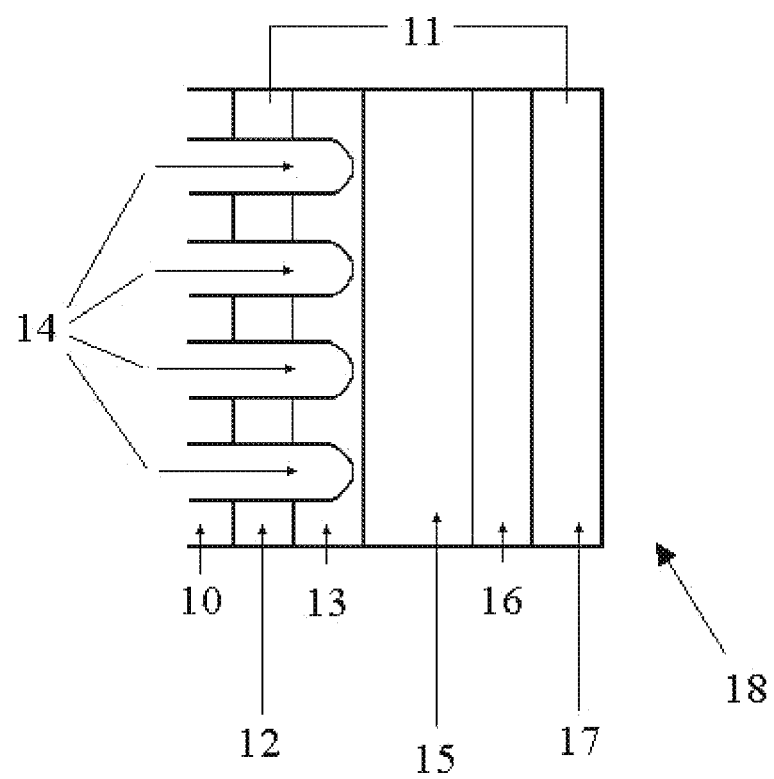
FIGS. 10 through 13 illustrate potential applications of the fabrication of nanobaskets by sputter deposition on porous substrates disclosed herein.

The nanostructures disclosed herein can be utilized in photovoltaic devices 18 as shown in FIG. 10. In typical photovoltaic devices, a transparent current collector must be used so that light may pass through it for interaction with the photovoltaic material. Using the layered nanostructure, a photovoltaic 18 could be manufactured by first depositing 14 a conducting metal layer 12 on the nanoporous substrate 10. This layer will serve as a current collector 12. A second layer of a photoactive semiconductor (photovoltaic layer) 13 will be deposited and allowed to cap over. The size of the pores in the nanoporous substrate 10 can be of the appropriate size to interact with light such that they function as a waveguide. This will facilitate the passage of light 11 through to open pores of the non-coated side of the nanoporous substrate 10. This light will be able to pass through the pores in the nanoporous current collector 12 impinging on the capped photovoltaic material 13. The size of the pore and the curvature of the cap portion of the nanobaskets could further accentuate the interaction of light by acting both as an additional waveguide and a lens, further focusing the light on the photovoltaic material 13 and enhancing performance. The completed photocell 18 would be constructed by placing an electrolyte 15, complementary electrode 16, and a second current collector 17, respectively on the capped side of the photovoltaic material 13.

Example 6

Figure 11:
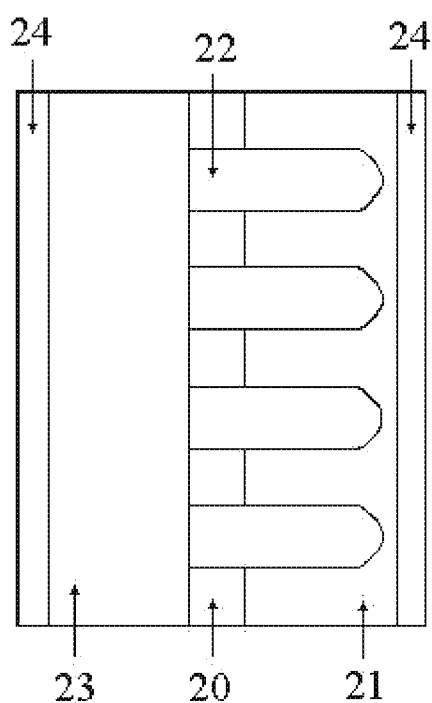

A multilayered, nanostructured material could also be used to make thin film battery systems as shown in FIG. 11. Using the layered nanostructure, a layer of nanobaskets of an appropriate battery electrode material 21 is sputter-coated onto a nanoporous substrate 20. The nanoporous substrate 20 and the nanobaskets 21 are filled with electrolyte 22 using capillary action to "pull" the electrolyte into the pores (as described in Applicant's U.S. Pat. No. 6,586,133, which is incorporated herein by reference in its entirety) or other techniques. The opposite side of the nanoporous substrate 20 would still have pores that are open, but filled with electrolyte 22. One configuration of the battery would now cover this end of the substrate with an appropriate electrode material forming a battery. Placing the electrode 23 on this side could be done by many methods including sputter-coating, spreading of pastes of composite electrode materials, etc. A current collector 24 would be affixed to this electrode 23. This thin film battery would have increased performance because of the increased surface area of the nanobasket electrode and because of the enhanced performance of electrolyte materials confined in nanoporous materials.

Example 7

Figure 12:
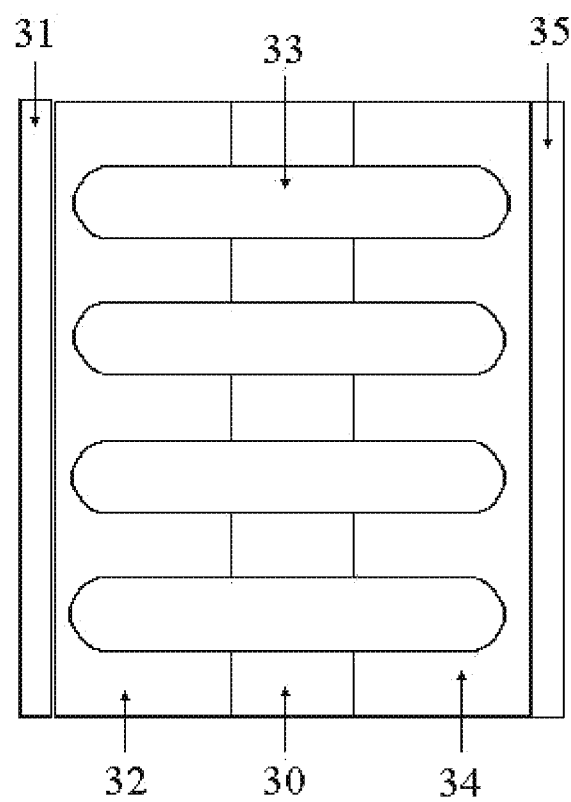

Another battery configuration as depicted in FIG. 12 would include first placing a layer of current collecting material 31, such as a metal, by sputter-coating on the nanoporous substrate 30. This current collecting layer 31 is capped with nanobaskets 33 of an appropriate battery electrode material. Using capillary action to "pull" the electrolyte into the pores, both the pores of the substrate 30 and those in the current collector 31 and the nanobaskets 33 are filled with electrolyte 32. The opposite side of the nanoporous substrate would still have pores that are open, but filled with electrolyte 34. Deposition of the complementary electrode 35 would again be done by using sputter-coating. Because of the nanoporous substrate 33, a nanobasket electrode layer 34 would be formed. This configuration would benefit from having two electrodes 32 and 34 both having a nanobasket configuration. This thin film battery would have increased performance because of the increased surface area of both of the nanobasket electrodes 32 and 34 and because of the enhanced performance of electrolyte materials confined in nanoporous materials.

Example 8

Figure 13:
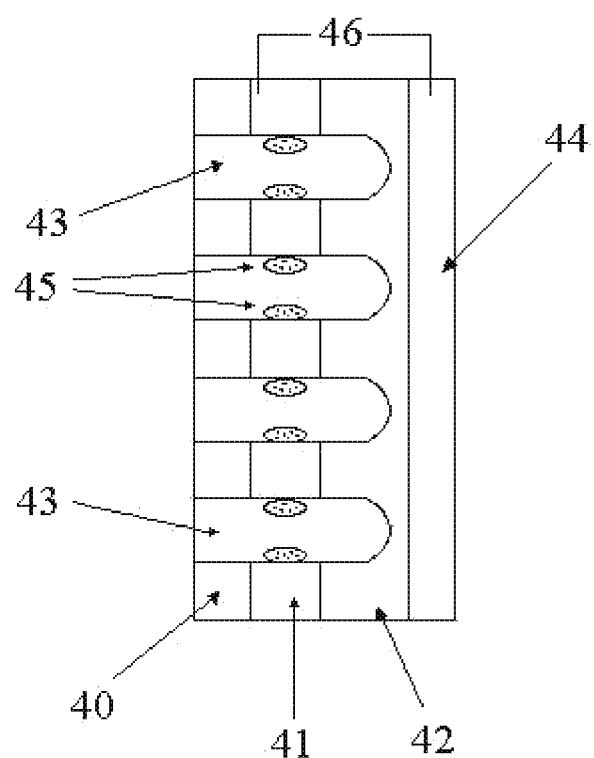

As shown in FIG. 13, another configuration would allow the in situ formation of a battery anode in a nanostructured thin film battery. This configuration includes first depositing a first layer of current collecting material 41 by sputter-coating on a nanoporous substrate 40. This layer 41 is not allowed to cap. This current collecting layer 41 is then capped with nanobaskets 42 of an appropriate battery cathode material by deposition by sputter-coating. This material must contain metal ions of the same composition of the anode desired to be formed. By using capillary action to "pull" the electrolyte into the pores, the pores of the substrate 40 and those in the current collector 41 and the nanobaskets 42 can be filled with electrolyte 43. A second current collector 44 would be placed on top of the nanobasket electrode layer 42. The opposite side of the nanoporous substrate would still have pores that are open, but filled with electrolyte 43. At this point a thin film battery could be formed by in situ deposition of an anode 45. This technique is applied to the nanostructured system by applying an appropriate current 46 to the two current collectors 41 and 44 drawing metal ions from the cathode layer 42 and through the electrolyte 43 present in the nano-pores. This will result in electrochemical plating of the metal anode 45 onto the current collector 41 that closest to the nanobasket openings. This plated metal would be the anode 45 formed in situ. Since this anode 45 would be in very close proximity to the nanobasket 42, cathode material, it would enhance performance. Since the anode 45 is deposited in situ and is not exposed to air, the anode 45 is less likely to be degraded by air exposure, thus eliminating a major problem in the development of thin-film lithium batteries. Once again, this thin film battery would also have increased performance because of the increased surface area of the nanobasket electrode and because of the enhanced performance of electrolyte materials confined in nanoporous materials.

Whereas, the invention has been described in relation to the drawings and claims, it should be understood that other and further modifications, apart from those shown or suggested herein, may be made within the scope of the invention.

What is claimed is:

1. A method of constructing a nanobattery, said method comprising the steps of:
   a. forming a nanostructured anode electrode directly on a nano-pitted anode substrate, wherein said nano-pitted anode substrate is an oxidized metal thin film configured as both an anode current collector and an anode growth substrate for said nanostructured anode electrode, including the step of nano-pitting said anode substrate through an electrochemical process;
   b. forming a nanostructured cathode electrode directly on a nano-pitted cathode substrate, wherein said nano-pitted cathode substrate is an oxidized metal thin film configured as both a cathode current collector and a cathode growth substrate for said nanostructured cathode electrode, including the step of nano-pitting said cathode substrate through an electrochemical process; and
   c. forming an electrolyte layer intermediate of said nanostructured anode cathode and said nanostructured anode to construct said nanobattery.

2. The method of claim 1 wherein said oxidized metal thin film forming said nano-pitted anode substrate and/or said oxidized metal thin film forming said nano-pitted cathode substrate is selected from the group consisting of aluminum (Al), antimony (Sb), bismuth (Bi), boron (B), cadmium (Cd), carbon (C), cerium (Ce), chromium (Cr), cobalt (Co), copper (Cu), dysprosium (Dy), erbium (Er), europium (Eu), gadolinium (Gd), germanium (Ge), gold (Au), graphite (C), hafnium (Hf), holmium (Ho), indium (In), iridium (Ir), iron (Fe), lanthanum (La), lutetium (Lu), magnesium (Mg), manganese (Mn), molybdenum (Mo), neodymium (Nd), nickel (Ni), niobium (Nb), palladium (Pd), platinum (Pt), praseodymium (Pr), rhenium (Re), ruthenium (Ru), samarium (Sm), selenium (Se), scandium (Sc), silver (Ag), silicon (Si), tantalum (Ta), terbium (Tb), thulium (Tm), tin (Sn), titanium (Ti), tungsten (W), vanadium (V), ytterbium (Yb), yttrium (Y), zirconium (Zr) or zinc (Zn).

3. The method of claim 1 wherein said oxidized metal thin film forming said nano-pitted anode substrate and/or said oxidized metal thin film forming said nano-pitted cathode substrate is selected from the group consisting of aluminum copper (AlCu), aluminum chromium (AlCr), aluminum magnesium (AlMg), aluminum silicon (AlSi), aluminum silver (AlAg), cerium gadolinium (CeGd), cerium samarium (CeSm), chromium silicon (CrSi), cobalt chromium (CoCr), cobalt iron (CoFe), cobalt iron boron (CoFeB), copper cobalt (CuCo), copper gallium (CuGa), copper indium (CuIn), copper nickel (CuNi), copper zirconium (CuZr), hafnium iron (HfFe), iron boron (FeB), iron carbon (FeC), iron manganese (FeMn), iridium manganese (IrMn), iridium rhenium (IrRe), indium tin (InSn), molybdenum silicon (MoSi), nickel aluminum (NiAl), nickel chromium (NiCr), nickel chromium silicon (NiCrSi), nickel iron (NiFe), nickel niobium titanium (NiNbTi), nickel titanium (NiTi), nickel vanadium (NiV), samarium cobalt (SmCo), silver copper (AgCu), silver tin (AgSn), tantalum aluminum (TaAl), terbium dysprosium iron (TbDyFe), terbium iron alloy (TbFe), titanium aluminum (TiAl), titanium nickel (TiNi), titanium chromium (TiCr), tungsten rhenium (WRe), tungsten titanium (WTi), zirconium aluminum (ZrAl), zirconium iron (ZrFe), zirconium nickel (ZrNi), zirconium niobium (ZrNb), zirconium titanium (ZrTi), zirconium yttrium (ZrY), zinc aluminum (ZnAl) or zinc magnesium (ZnMg).

4. The method of claim 1 wherein said step of forming said nanostructured anode electrode further comprises the step of depositing at least one anode material directly on said oxidized metal thin film forming said nano-pitted anode substrate and/or wherein said step of forming said nanostructured cathode electrode further comprises the step of depositing at least one cathode material directly on said oxidized metal thin film forming said nano-pitted cathode substrate.

5. The method of claim 4 wherein said step of depositing said anode material and/or said step of depositing said cathode material is accomplished by sputter-coating, chemical vapor deposition or pulsed laser method.

6. The method of claim 5 wherein said sputter-coating is selected from the group consisting of direct current sputter-coating, radio frequency sputter-coating, magnetron sputter-coating or reactive sputter-coating.

7. The method of claim 4 wherein said anode material and/or said cathode material is selected from the group consisting of conductive materials consisting of an oxide, polymeric, ceramic, mineral or metallic material.

8. The method of claim 7 wherein said anode material is selected from the group consisting of carbon, silicon, graphite, a mixed metal oxide, hydroxyapatite, nichrome or graphite.

9. The method of claim 7 wherein said anode material further comprises tin oxide ($SnO_2$), zinc oxide, copper oxide, titanium oxide, titanium dioxide, vanadium pentoxide, magnesium oxide or silicon dioxide.

10. The method of claim 7 wherein said cathode material is selected from the group consisting of carbon, silicon, graphite, a copper oxide, graphite, a lithium-containing oxide, a phosphate, a fluorophosphate, a silicate, tin oxide, zinc oxide, titanium oxide, titanium dioxide, vanadium pentoxide, magnesium oxide, silicon dioxide, nichrome or hydroxyapatite.

11. The method of claim 7 wherein said cathode material further comprises lithium cobalt oxide ($LiCoO_2$), tin oxide ($SnO_2$), $Li_4Ti_5O_{12}$, $Li_4Ti_5O_{12}$, zinc oxide, copper oxide, titanium oxide, titanium dioxide, vanadium pentoxide, magnesium oxide, silicon dioxide, nichrome, $Li_4Ti_5O_{12}$, $Li_4Ti_5O_{12}$, $LiNixCO_{1-2x}MnO_2$, $LiNi_{0.5}Mn_{1.5}O_4$, $Li(Ni_{0.8}Co_{0.15}Al_{0.05})O_2$, $LiMn_2O_4$, iron olivine ($LiFePO_4$), $LiFe_{1-x}MgPO_4$, $LiMoPO_4$, $LiCoPO_4$, $LiNiPO_4$, $Li_3V_2(PO_4)_3$, $LiVOPO_4$, $LiMP_2O_7$, $LiFe_{1.5}P_2O_7$, $LiVPO_4F$, $LiAlPO_4F$, $Li_5V(PO_4)_2F_2$, $Li_5Cr(PO_4)_2F_2$, $Li_2CoPO_4F$, $Li_2NiPO_4F$, $Li_2FeSiO_4$, $Li_2MnSiO_4$ or $Li_2VOSiO_4$.

12. The method of claim 1 further comprising the steps of:
 a. chemically polishing a metal thin film in a first acid for a predetermined amount of polishing time;
 b. oxidizing said metal thin film with an acidic solution in an electrochemical cell at a predetermined temperature, a first predetermined voltage potential and for a predetermined amount of oxidation time;
 c. decreasing said first predetermined voltage potential at a predetermined step-down rate to a second predetermined voltage potential; and
 d. etching said oxidized metal thin film with a second acid to form said anode nano-pitted substrate and/or said cathode nano-pitted substrate.

13. The method of claim 1 wherein each of said nano-pits of said nano-pitted anode substrate and said nano-pitted cathode substrate has a diameter of up to about 200 nanometers and a depth of up to about 150 nanometers.

* * * * *